United States Patent
White et al.

(10) Patent No.: US 11,024,529 B2
(45) Date of Patent: Jun. 1, 2021

(54) SYSTEM AND METHOD FOR RESIDUAL VOLTAGE CONTROL OF ELECTROSTATIC CHUCKING ASSEMBLIES

(71) Applicant: Applied Materials, Inc., Santa Clara, CA (US)

(72) Inventors: John M. White, Hayward, CA (US); Shreesha Y. Rao, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 540 days.

(21) Appl. No.: 15/945,461

(22) Filed: Apr. 4, 2018

(65) Prior Publication Data

US 2019/0311933 A1 Oct. 10, 2019

(51) Int. Cl.
*H01L 21/683* (2006.01)
*H01L 21/67* (2006.01)
*H01L 51/56* (2006.01)

(52) U.S. Cl.
CPC .... *H01L 21/6833* (2013.01); *H01L 21/67017* (2013.01); *H01L 51/56* (2013.01)

(58) Field of Classification Search
CPC .............. H01L 21/6833; H01L 21/67017; H01L 51/56
USPC .......................................................... 361/234
See application file for complete search history.

(56) References Cited

U.S. PATENT DOCUMENTS

| | | | |
|---|---|---|---|
| 5,745,331 A | 4/1998 | Shamouilian et al. | |
| 5,754,391 A * | 5/1998 | Bates | H01L 21/6831 361/234 |
| 6,088,213 A | 7/2000 | Herchen | |
| 6,108,189 A | 8/2000 | Weldon et al. | |
| 8,238,072 B2 | 8/2012 | Fujisawa et al. | |
| 9,117,868 B1 | 8/2015 | Nangoy | |
| 2007/0223173 A1* | 9/2007 | Fujisawa | H02N 13/00 361/234 |
| 2016/0285052 A1* | 9/2016 | Lee | H01L 21/6831 |
| 2018/0053676 A1 | 2/2018 | White et al. | |

FOREIGN PATENT DOCUMENTS

| | | |
|---|---|---|
| JP | 2006179895 A | 7/2006 |
| JP | 2007173592 A | 7/2007 |
| WO | 2015042304 A1 | 3/2015 |
| WO | 2015171207 A1 | 11/2015 |

OTHER PUBLICATIONS

JP-2007-173592, Itonaga Naoko; Entire specification and drawings; Date: Jul. 5, 2007 (Year: 2007).*
JP-2006-179895, Fuwa Ko; Entire specification and drawings; Date: Jul. 6, 2006 (Year: 2006).*
TW Application No. 108104144 Office Action and Search Report dated May 4, 2020.
International Search Report and Written Opinion PCT/US2019/015012 dated Jul. 30, 2019.

* cited by examiner

Primary Examiner — Dharti H Patel
(74) Attorney, Agent, or Firm — Patterson + Sheridan LLP

(57) ABSTRACT

Described herein is a substrate carrier comprising electrostatic chuck panels and using the same. The electrostatic chuck panels may include electrodes with interleaved segments. Further, the electrodes of each electrostatic chuck panel may be driven with chucking voltages having opposite polarities.

7 Claims, 18 Drawing Sheets

SYSTEM AND METHOD FOR RESIDUAL VOLTAGE CONTROL OF ELECTROSTATIC CHUCKING ASSEMBLIES

BACKGROUND

Field

Embodiments described herein generally relate to a bipolar electrostatic chuck suitable for use with substrate carriers, substrate supports and the like, for securing substrates during processing.

Description of the Related Art

In the processing of substrates, such as semiconducting substrates and displays, the substrate is held on a substrate support surface of a substrate carrier or substrate support in a process chamber during processing. The substrate support surface can include an electrostatic chuck (ESC) that has one or more electrodes capable of being electrically biased to hold the substrate to the substrate support surface. Some ESC designs include two or more electrodes that are charged to create the charge separation in the substrate supported on the ESC. The charge separation induced in the substrate by the ESC creates an electrostatic chucking force with the oppositely charged electrode disposed in the ESC, thereby securing the substrate to the substrate support surface of the substrate carrier or substrate support.

In the processing of various display substrates, for example, organic light emitting diode (OLED) displays and the like, a high degree of flatness of the substrate is desired for proper mask alignment. As a result of the substrate being chucked to the substrate carrier and ESC utilizing voltages that may induce arcing between the bipolar electrodes, damage to the ESC and potential release of contamination into the processing environment may occur. Once the ESC is damaged, the ESC should be repaired which usually includes replacement of the entire ESC.

Further, in various instances, the electrostatic field may be non-uniform across an ESC which may introduce irregularities within a chucked display substrate during processing. Such irregularities undesirably reduce production yield. Further, the residual electrostatic field on the surface of the substrate because of the ESC may cause some deleterious effects on the thin-film transistor (TFT) films deposited on the substrate.

Therefore, there is a need in the art for an ESC that does not introduce at least these irregularities and which minimizes the residual electrostatic field on the surface of the substrate close to zero.

SUMMARY

In one aspect, a substrate carrier comprises a first and second electrostatic chuck panel disposed adjacent to each other. The first electrostatic chuck panel comprises a first electrode residing in a single plane and adapted to be driven with a chucking voltage having a first polarity, and a second electrode residing in a single plane and adapted to be driven with a chucking voltage having a second polarity different than the first polarity. The second electrostatic chuck panel comprises a first electrode residing in a single plane and adapted to be driven with the chucking voltage having the second polarity, and a second electrode residing in a single plane and adapted to be driven with the chucking voltage having the first polarity. The second electrode of second electrostatic chuck panel is disposed adjacent to the first electrode of the first electrostatic chuck panel, and the first polarity is different than the second polarity.

In one aspect, an electrostatic chuck panel comprises a first electrode and a second electrode. The first electrode has a first plurality of segments residing in a single plane and connecting at first corners is interleaved with the second electrode. The second electrode has a second plurality of segments residing in a single plane and connected at second corners. A first one of the second corners is disposed between a first one of the first corners and a second one of the first corners.

In one aspect, a method for chucking a substrate comprises disposing a large area substrate against a substrate support surface of an electrostatic chuck panel, the electrostatic chuck panel including a plurality of electrodes disposed in different planes, applying a first voltage to a first electrode of the electrostatic chuck panel, applying a second voltage to a second electrode of the electrostatic chuck panel that is disposed farther from the substrate than the first electrode, wherein the second voltage has a different polarity than the first voltage, and electrostatically chucking the large area substrate to the substrate support surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Described herein are an electrostatic chuck panels and methods for using the same. In one example, a electrostatic chuck panel includes a plurality of electrodes disposed in different planes and biased with asymmetric voltages. Further, the electrode widths of the electrode segments of the electrodes disposed in different planes are at least about equal. The different voltages applied to the electrodes compensate for positioning the electrodes of the electrostatic chucking assembly in different planes, thereby making the residual electrostatic field on the top surface of the substrate uniform and close to zero, hence facilitating more uniform processing of substrates. In another example, an electrostatic chuck panel includes a plurality of electrodes disposed in different planes and biased with symmetric voltages. Further, the segments of the electrodes disposed on the bottom plane are wider than the segments of the electrodes disposed on the top plane. The electrodes in each plane are driven with symmetric voltages that differ in polarity. In such an example, the combination of asymmetric electrode segment widths and symmetric drive voltages reduces the residual electrostatic field on the top surface of the substrate, such that it is about zero.

Figure 1A:
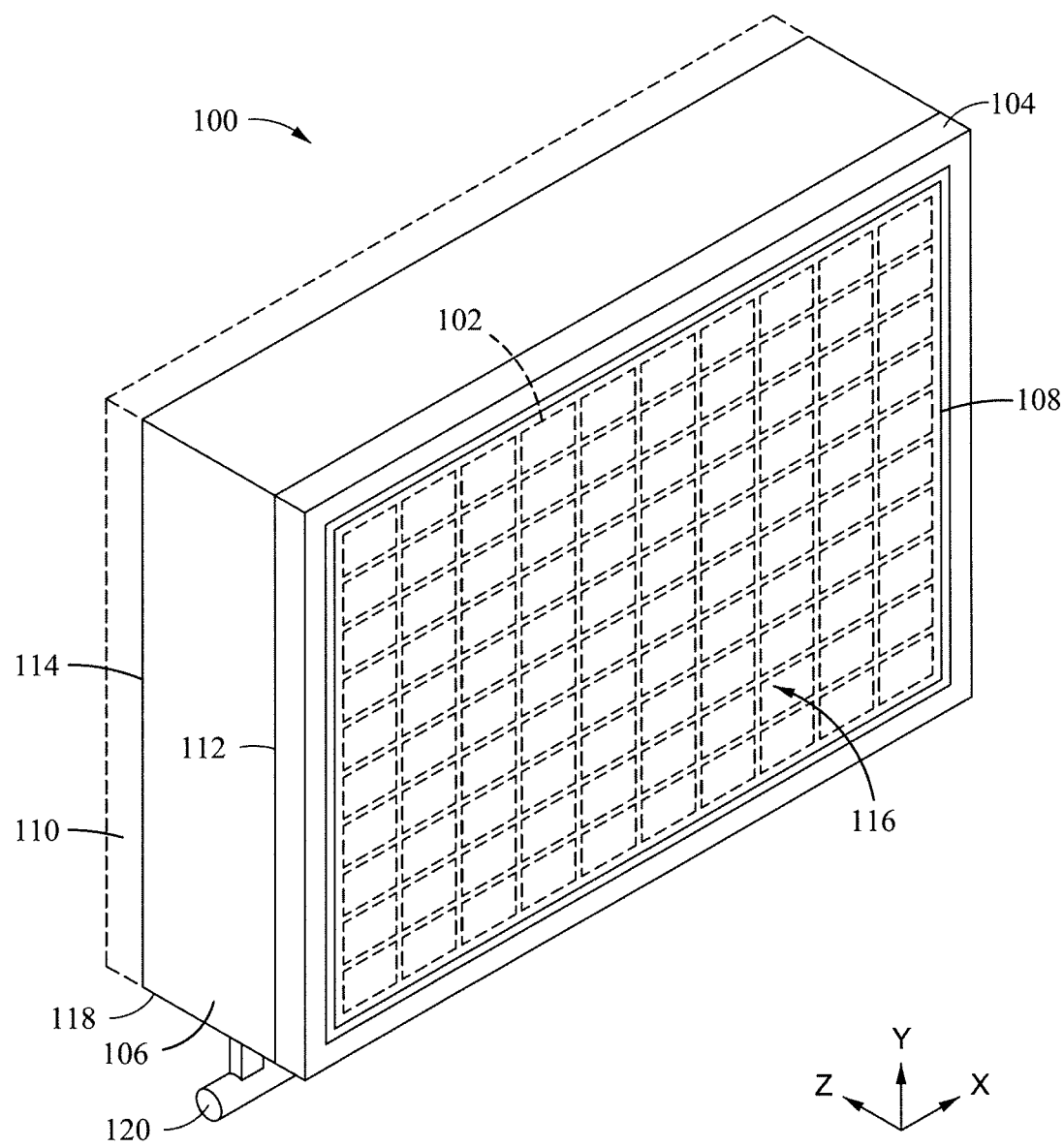
FIG. 1A is a schematic perspective view of a substrate carrier with an integrated ESC according to one embodiment disclosed herein.

FIG. 1A is a schematic perspective view of a substrate carrier 100 having an ESC 104 thereon, according to one embodiment disclosed herein. Referring now to FIG. 1A, a perspective view of an electrostatic chuck (ESC) 104 integrated with a substrate carrier 100 is shown. The ESC 104 enables the substrate carrier 100 to transport and support a large area substrate while moving between processing and other chambers. In one example, the ESC 104 can be configured to support one or more substrates and may have a substrate support surface 116 of at least 0.174 square meters ($m^2$). In general, the size of the substrate support surface 116 of the ESC 104 may be between 1 $m^2$ and about 12 $m^2$, for example, between about 2 $m^2$ and about 9 $m^2$. In other examples, the substrate support surface 116 of the ESC 104 may be adapted for transporting one or more large area substrates, such as substrates having a plan area of about 1.4 $m^2$ and greater.

The substrate may be made from any material suitable for material deposition, such as, for an OLED fabrication processes, among other processes. For example, the substrate may be made from materials such as glass (e.g. soda lime glass, borosilicate glass, etc.), metal, polymer, ceramic, compound materials, carbon fiber material and combinations thereof.

The ESC 104 may be used to transport the substrate during a plasma process, including chemical vapor deposition (CVD) processes, physical vapor deposition (PVD) processes, etching processes, or any suitable plasma or vacuum process, for example, OLED display manufacturing processes. The ESC 104 may also be adapted for use in non-plasma and non-vacuum environments and may be compatible for high temperature applications. Although various embodiments of an ESC 104 are disclosed herein, it is contemplated that electrostatic chucks from other manufacturers may be adapted to benefit from the disclosure provided herein.

The substrate carrier 100 is adapted to transport a substrate in a vertical orientation on the substrate support surface 116 of the ESC 104. The substrate carrier 100 includes the ESC 104, a carrier body 106, an optional backside ESC 110, and an optional translational member 120. When utilized, a backside ESC 110 is used to hold one or more second large area substrates on the opposite side of the carrier body 106. The backside ESC 110 may be fabricated substantially identical to the ESC 104.

The ESC 104 includes a chuck body 108 and an electrostatic chucking assembly having a plurality of independently replaceable electrostatic chuck panels 102 arranged on chuck body 108. An electrostatic chucking assembly is an arrangement of one or more electrostatic chuck panels 102 with ESC 104. The electrostatic chuck panels 102 of the ESC 104 form the substrate support surface 116 of the ESC 104. The electrostatic chuck panels 102 may be arranged in a Cartesian array (i.e., a 2-dimential array of rows and columns) or other pattern in an electrostatic chuck panel across the substrate support surface 116. Each electrostatic chuck panel 102 may be independently replaced without disturbing the other electrostatic chuck panels 102 of the ESC 104, thereby making repair and reconditioning of the ESC 104 more rapid and less costly.

The chuck body 108 may be made of ceramic or other material, such as aluminum. In some embodiments, the chuck body 108 and carrier body 106 may be fabricated as a single component, and as such, reference to the chuck body 108 and carrier body 106 may be utilized interchangeably. In such embodiments, the electrostatic chuck panels 102 are mounted directly to the chuck body 108. The chuck body 108 is disposed on a first surface 112 of the carrier body 106. The optional backside ESC 110 may be disposed on a second surface 114 of the carrier body 106 opposite the first surface 112. The optional translational member 120 may be coupled to a bottom surface 118 of the carrier body 106. The bottom surface 118 extends between the first surface 112 and the second surface 114.

Figure 1B:
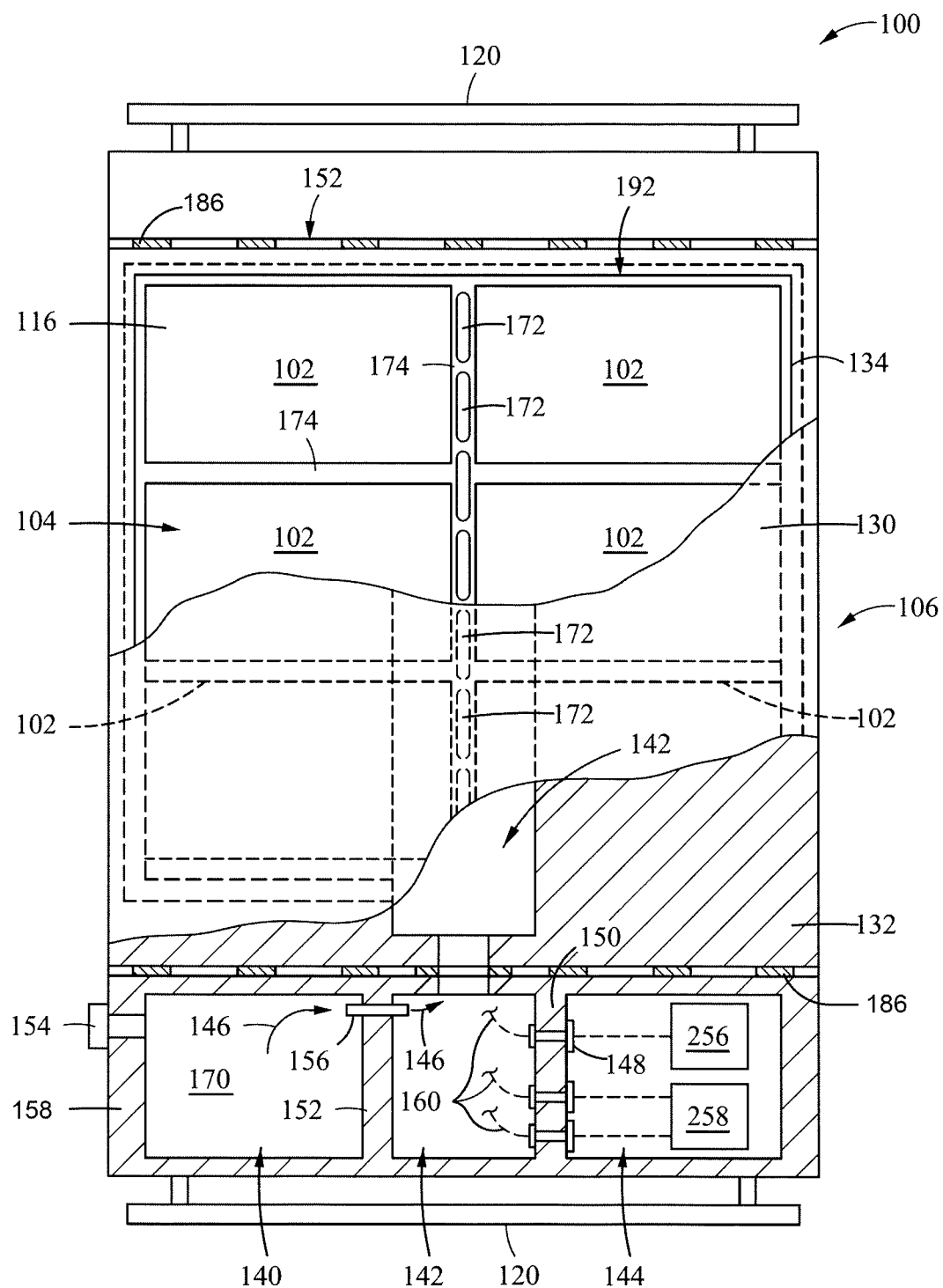
FIG. 1B illustrates a front cut-away view of a substrate carrier according to an embodiment disclosed herein.

FIG. 1B is a front cut-away view of the substrate carrier 100. The substrate carrier 100 is shown with a reduced number of electrostatic chuck panels 102 included in the ESC 104 as compared to the illustrations of FIG. 1A. In FIG. 1B, the electrostatic chuck panels 102 making up the electrostatic chuck panel are shown partially cut away to expose base plate 132 and one or more cavities which may be covered with one or more cover plates (not shown). The base plate 132 includes a number of cavities that are covered or enclosed by one or more cover plates. The cavities formed in the base plate 132 may include one or more of a gas cavity 140, a gas delivery manifold cavity 142, and an electrical utilities cavity 144. Although the gas and electrical utilities cavities 140, 144 may be arranged in any location within the substrate carrier 100, in the embodiment depicted in FIG. 1B, the cavities 140, 144 are positioned at the bottom of the substrate carrier 100, for example adjacent the translational member 120, when present. In another embodiment, a first cover plate is disposed over cavity 140, a second cover plate is disposed over cavity 142, and a third cover plate is disposed over cavity 144. In one embodiment, cavity 142 is split into an upper and lower portion, and each portion may be covered by two separate cover plates. For example, gas delivery manifold cavity 142 may include an upper portion and a lower portion, where each portion is covered by a different cover plate. Each cover plate may include an O-ring or other sealing member to seal each corresponding cavity from the process chamber vacuum. In the example depicted in FIG. 1B, six electrostatic chuck panels 102 are arranged on a cover plate in a 2×3 array.

In various embodiments, the cavities 140, 144 are positioned beyond the planar extents (i.e., not overlapping) with the electrostatic chuck panels 102 which advantageously prevents heat from being transferred from the substrate to electrostatic chuck panels 102, and the base plate 132, thus preventing the cavities 140, 144 from being excessively heated. Thus, the functioning of the electrical components present in the electrical utilities cavity 140 and pressure of the gas contained in the gas cavity 140 are also protected from being excessively heated. Further, in one embodiment, a lower portion of gas delivery manifold cavity 142 is also disposed beyond the planar extents with the electrostatic chuck panels.

The electrical utilities cavity 144 is separated from the gas delivery manifold 142 by a first interior wall 150. The electrical utilities cavity 144 houses the ESC control electronics 256 and one or more power sources 258. In one embodiment, the one or more power sources include a low voltage power source and/or a high voltage power source configured to operate the electrostatic chuck panels 102. The low voltage power source may include a battery. The high voltage power source may include a high voltage operational amplifier and may be coupled to the battery to generate the chucking voltages. In one embodiment, the low voltage power source may be used to power the control electronics 256 which are configured to control the high voltage power source to provide high voltage to the electrostatic chuck panels 102. Electrical vacuum feed-throughs 148 are installed through the wall 150 to facilitate routing of the leads 160 between the control electronics 256 and the one or more power sources 258, and the electrostatic chuck panels 102 disposed on a cover plate. In one embodiment, the electrical vacuum feedthroughs provide a passage way between the electronics utilities cavity 144 which is at about 1 ATM and the gas delivery manifold 142 which is at a low vacuum condition. In one embodiment, the low vacuum condition may be about 5 Torr.

The gas cavity 140 is separated from the gas delivery manifold cavity 142 by a second interior wall 152. The gas cavity 140 is configured to function as the gas source 170. The gas cavity 140 may be charged with gas via a self-sealing quick disconnect fitting 154 mounted through an exterior wall 158. For example, an external gas source (not shown) may be temporarily coupled to the quick disconnect fitting 154 to allow gas cavity 140 to be charged (i.e., pressurized) with a gas that will be utilized as a backside gas between the electrostatic chuck panels 102 and the substrate chucked thereon. In one embodiment, the backside gas may be used to transfer heat from the substrate to the electrostatic chuck panels 102, and then to the thermal mass of the base plate 132.

The volumetric size of the gas cavity 140 may be selected to provide a sufficient volume of backside gas between the substrate and the electrostatic chuck panels 102 to last for the duration in which the substrate is processed while being held on the substrate carrier 100 between recharging of the gas cavity 140 through the quick disconnect fitting 154. Thus, the volume size of the gas cavity 140 may be selected in consideration of the size substrate, the amount of backside gas escaping from under the edge of the substrate, and the expended duration between recharging of the gas cavity 140. In one embodiment, the volumetric size of the gas cavity 140 is between about 1 and about 10 liters.

At least one aperture 156 is formed through the second interior wall 152 to fluidly couple the gas delivery manifold 142 to the gas cavity 140. The aperture 156 has a small orifice so that gases disposed in the gas cavity 140 flow into the gas delivery manifold 142 (as shown by arrows 146) at a rate sufficiently slow enough to provide a sufficient amount of backside gas between the substrate and the electrostatic chuck panels 102 to last for the duration that the substrate is processed. In one embodiment, the aperture 156 has a diameter of about 0.0010 to about 0.0050 inches. In another embodiment, the aperture 156 has a diameter sufficient to provide a flow rate of backside gas of about 20 to about 200 sccm. Optionally, the flow through the aperture 156 may be controlled by a valve (not shown). The valve may be an on/off valve, or a needle valve operable to control the flow out of the gas cavity 140 flow into the gas delivery manifold 142 through the aperture 156.

The gas delivery manifold 142 generally extends below the portion of the substrate carrier 100 upon which the electrostatic chuck panels 102 are mounted. In one or more embodiments, the gas delivery manifold 142 provides an electrical conduit for routing the leads 160 between the electrostatic chuck panels 102 and the one or more power sources 258

The gas delivery manifold 142 is also utilized to route the backside gas from the cavity 140 (i.e., the gas source 170) to the one or more apertures 172 formed through the base plate 132. The backside gas flowing through the one or more apertures 172 flows between the grooves 174 between the electrostatic chuck panels 102 across the surface of the substrate carrier 100 to enhance heat transfer between the electrostatic chuck panels 102 and the substrate chucked thereto.

In the embodiment shown in FIG. 1B, the gas delivery manifold 142 is formed in the base plate 132 and is enclosed by a cover plate. The gas delivery manifold 142 has a substantially elongated shape and extends from the bottom of the base plate 132 adjacent the gas cavity 140 to the top of the substrate carrier 100. In one embodiment, the gas delivery manifold 142 may include an upper and lower portion, where the upper and lower portions are connected via a thermal break 182 having an opening. For example, one or more the thermal breaks 182 may include an opening to allow the free flow of gas and electrical routings there between. One or more sealing members may be formed within a thermal break and/or within the carrier 100 proximate the cavity to prevent gas from escaping. The gas delivery manifold cavity 142 may be generally aligned below the interface between adjacent electrostatic chuck panels 102 so that the apertures 172 formed in a cover plate may be generally aligned in a column when fluidly connecting the grooves 174 between the adjacent electrostatic chuck panels 102 and the gas delivery manifold 142 through the apertures 172. Thus, the backside gas may freely flow from gas delivery manifold 142 through the apertures 172 and into the grooves 174 between the facing edges of the adjacent electrostatic chuck panels 102 that are aligned above the gas delivery manifold 142. Once the backside gas is in the grooves 174 aligned in a first direction above the gas delivery manifold cavity 142, the backside gas flows laterally outward into the adjacent grooves 174 that are arranged in a second direction between adjacent electrostatic chuck panels 102 that extend laterally away from the gaps grooves above the apertures 172. For example, the backside gas fed from the apertures 172 into the grooves 174 aligned in the first direction flows orthogonally into the grooves 174 that are aligned in the second direction. That is, the first direction is orthogonal to the second direction.

In one example, grooves 174 that are aligned in the second direction are not in direct fluid communication with the apertures 172 except as provided by connection with the grooves 174 that are aligned in the first direction. The grooves 174 that are aligned in the second direction may also provide gas into the channel 134 disposed below the unsupported portion 192 of a lip seal in addition or alternatively to the channel 134 being provide with gas from the gas source or the fluid source.

In various embodiments, regions of the carrier 100 are separated from each other by thermal breaks disposed between regions. The thermal breaks 182 helps reduce the amount of heat transferring from the region of the substrate carrier 100 on which the electrostatic chuck panels 102 are mounted to the region of the substrate carrier 100 that contains the gas cavity 140 and the electrical utilities cavity 144. Thus, the thermal break 182 advantageously keeps the gases within the gas cavity 140 from heating, while also keeping the control electronics 256 and the one or more power sources 258 disposed in the electrical utilities cavity 144 from heating.

In one embodiment, carrier 100 includes a large plate, where slots are machined within the plate to form the thermal breaks 182. In such an embodiment, the gas delivery manifold cavity 142 is a single large cavity covered by a single cover plate. In another embodiment, the carrier 100 includes a first and second region that are coupled together, and thermal breaks 182 are installed between the first and second regions of the carrier. In such an embodiment, the gas delivery manifold cavity 142 comprises an upper region and a lower region each covered by a separate cover plate. Further, the upper and lower regions of the gas delivery manifold cavity 142 are coupled together through one or more passageways in one or more thermal breaks. The one or more passageways may also be used to pass electrical leads between the regions of the carrier 100. In one embodiment, the one or more thermal breaks comprising the passageways are disposed proximate the gas delivery manifold cavity 142. For example, the one or more thermal breaks may be disposed near a center portion of carrier 100.

The thermal breaks 182 may be fabricated from a material having a thermal conductivity less than the thermal conductivity of the cover plates and the base plate 132. Suitable materials for fabricating the thermal breaks 182 include ceramics and polymers. In the example depicted in FIG. 1B, the thermal breaks 182 are fabricated from an organic thermoplastic polymer such as polyaryletherketone (PAEK), for example polyether ether ketone (PEEK). In one embodiment, the thermal breaks 182 are fabricated within carrier 100 by machining a plurality of slots in the carrier 100 to form the thermal breaks 182.

Figure 2:
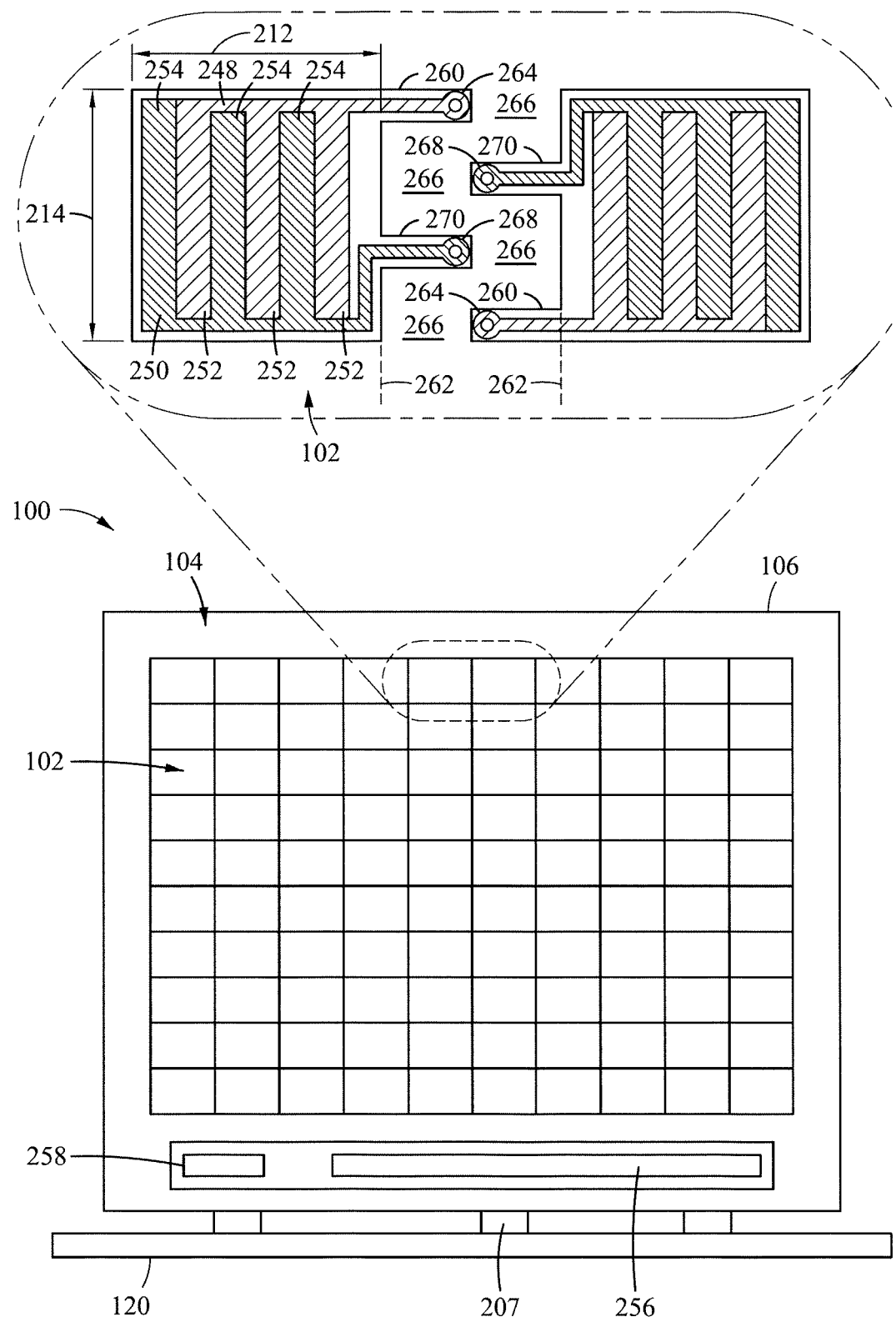
FIG. 2 is a schematic front view of the substrate carrier of FIG. 1.

FIG. 2 is a schematic front view of the substrate carrier 100 of FIG. 1. Each electrostatic chuck panel 102 of the ESC 104 includes at least two sets of distributed electrodes 248, 250. The electrodes 248, 250 may be arranged in any desired configuration such that the electrodes 248, 250 may be energized in a bipolar manner. The bipolar manner is selected to create an electrostatic force sufficient to secure the substrate to the substrate support surface 116 of the substrate carrier 100. The different sets of electrodes 248, 250 can be equally spaced apart, or arranged in any other desired configuration. For example, the sets of electrodes 248, 250 may be arranged in columns, rows, arrays, or other patterns configured to provide desired chucking characteristics. Each electrode 248, 250 may be charged with different polarities, thus generating an electrostatic force. The multiple sets of electrodes 248, 250 may be configured to laterally distribute the electrostatic force across the substrate support surface 116 of the chuck body 108. In one example, electrodes 248 and 250 are disposed in different planes. In one example, the planes are parallel to one another.

In various embodiments, the first electrode 248 of an electrostatic chuck panel 102 may be coplanar with the first electrode 248 of another chuck panel 102. Similarly, second electrodes (e.g. second electrodes 250) of multiple electrostatic chuck panels 102 may be coplanar. In a specific example, all first electrodes 248 of the electrostatic chuck panels 102 may be coplanar, and all second electrodes of the electrostatic chucks 102 may be coplanar In one example, the first electrode 248 may include a plurality of electrode segments 252 that are interleaved with a plurality of electrode segments 254 of the second electrode 250. It is believed that the electrode interleaved segments 252, 254 provide local electrostatic attraction distributed across a large area of the ESC 104 in which the aggregation provides a high chucking force while utilizing less chucking voltage as compared to conventional designs. The electrode segments 252, 254 may be formed to have different lengths and geometry. In one embodiment, the electrode segments 252, 254 may have a width of between about 0.1 mm and about 1 mm, for example about 0.25 mm to about 0.5 mm, which may vary depending upon the material type to be chucked. In one embodiment, the electrode segments 254 are wider than the electrode segments 252. For example, the electrode segments 254, such as about 1.5 to about 5 times, or about 2 to about 2.5 times as wide. If desired, electrode segments 252, 254 may be configured with different sizes that interleave with each other. The electrode segments 252, 254 may be alternatively and repeatedly formed until a desired number of electrode segments 252, 254 form a desired pattern. In one example, the electrode segments 252, 254 have a horizontal distance separating adjacent electrode segments of 252, 254 of zero mm. Thus, lengthwise edges of adjacent electrode segments 252, 254 are coplanar. Similarly, second electrodes 250 of multiple electrostatic chuck panels 102 may be coplanar. In a specific example, all first electrodes 248 of the electrostatic chuck panels 102 may be coplanar, and all second electrodes 250 of the electrostatic chucks 102 may be coplanar The electrode segments 252, 254 of each electrode 248, 250 are generally disposed on or between one or more dielectric sheets 280a, 280b, 280c. In one embodiment, first electrodes are printed on base sheets of polyimide (280c), and an intermediate dielectric sheet (280b) sheet. The intermediate dielectric sheet may be disposed onto the first electrodes and second electrodes are printed on the intermediate sheet 280b. A third dielectric sheet (280a) may then be disposed over the second electrodes. The electrodes may comprise a material such as copper, tungsten, or the like. In another embodiment, an intermediate dielectric sheet (280b) may comprise an electro-deposited conductive material disposed as layers on both sides. The top and bottom layers of conductive material may be etched to create top and bottom electrodes. In one embodiment, the top and bottom layers may be etched simultaneously. After etching, a top sheet 280a may be disposed over the top electrode and a bottom sheet 280c may be applied to the bottom electrode. The conductive material may be copper.

Figure 3A:
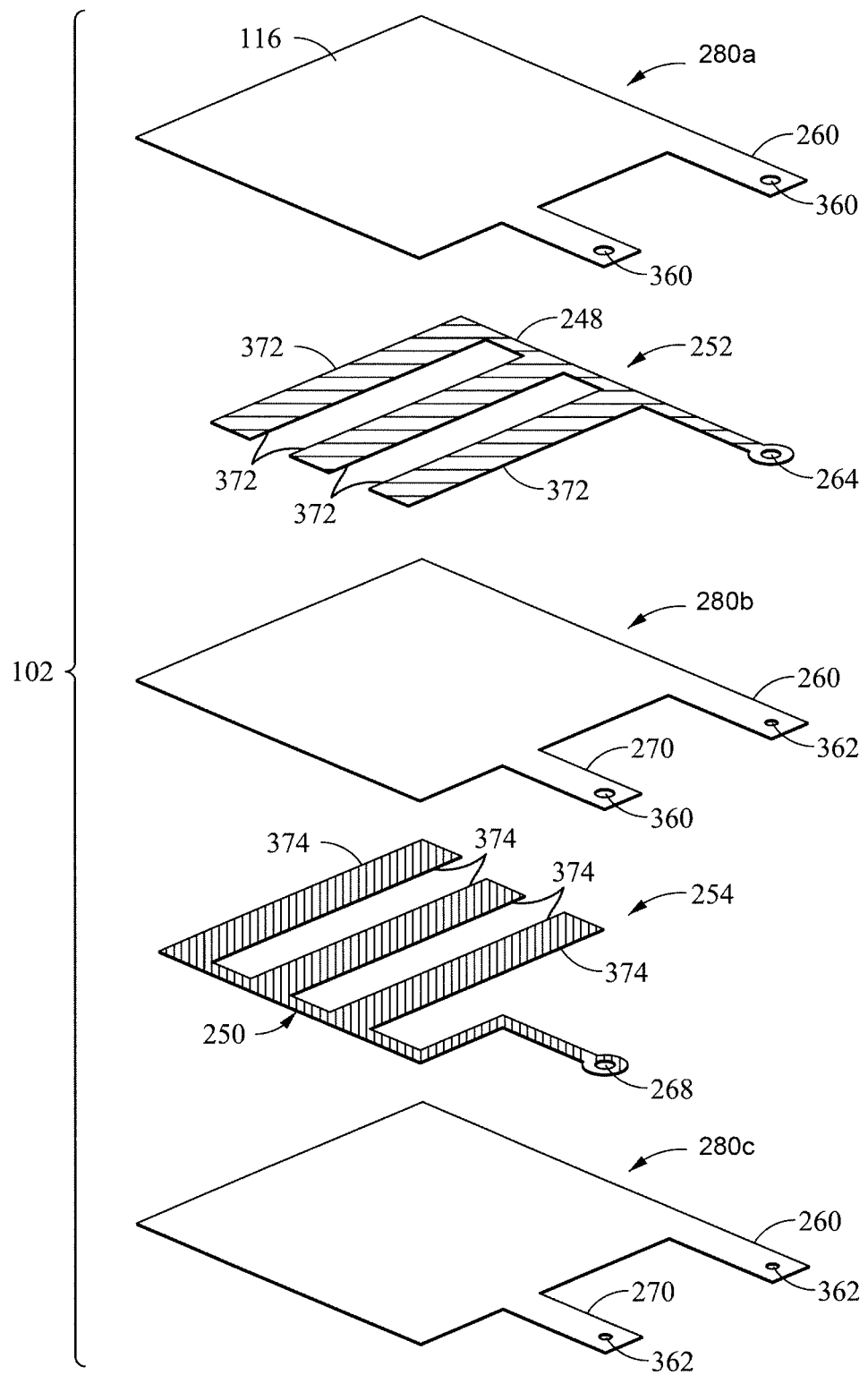
FIGS. 3A and 3B illustrate a schematic exploded view of an electrostatic chuck panel of the ESC of FIG. 1.

In one embodiment, the first electrode 248 and second electrode 250 have a height in the range of about 6 um to about 9 um. The height of the electrodes may correspond to the distance the material of the electrodes extends off of a corresponding dielectric sheet the electrodes are disposed thereon. Each electrode may have a common height, or the electrodes may differ in height. In one embodiment, the height of each electrode may vary such that the height remains within the range of about 6 um to about 9 um. In other embodiments, one of the first electrode 248 and the second electrode 250 has a height in the range of about 6 um to about 9 um and the other electrode has a height of either less than about 6 um or greater than about 9 um One or more of the dielectric sheets 280a, 280b, 280c may include a first tab 260 and/or a second tab 270 extending therefrom. The tabs 260, 270 are shown extending from the same side of the dielectric sheets 280a, 280b, 280c, but may alternatively extend from opposite or adjacent sides of the dielectric sheets 280a, 280b, 280c. In one example, each electrostatic chuck panel 102 includes three dielectric sheets 280a, 280b, 280c, with each of the electrodes 248, 250 alternately positioned between dielectric sheets 280a, 280b, 280c, as shown in FIG. 3A. In various embodiments, the second electrode 250, which would generally not be visible due to the placement of one or more dielectric sheets 280a, 280b thereon.

Figure 3B:
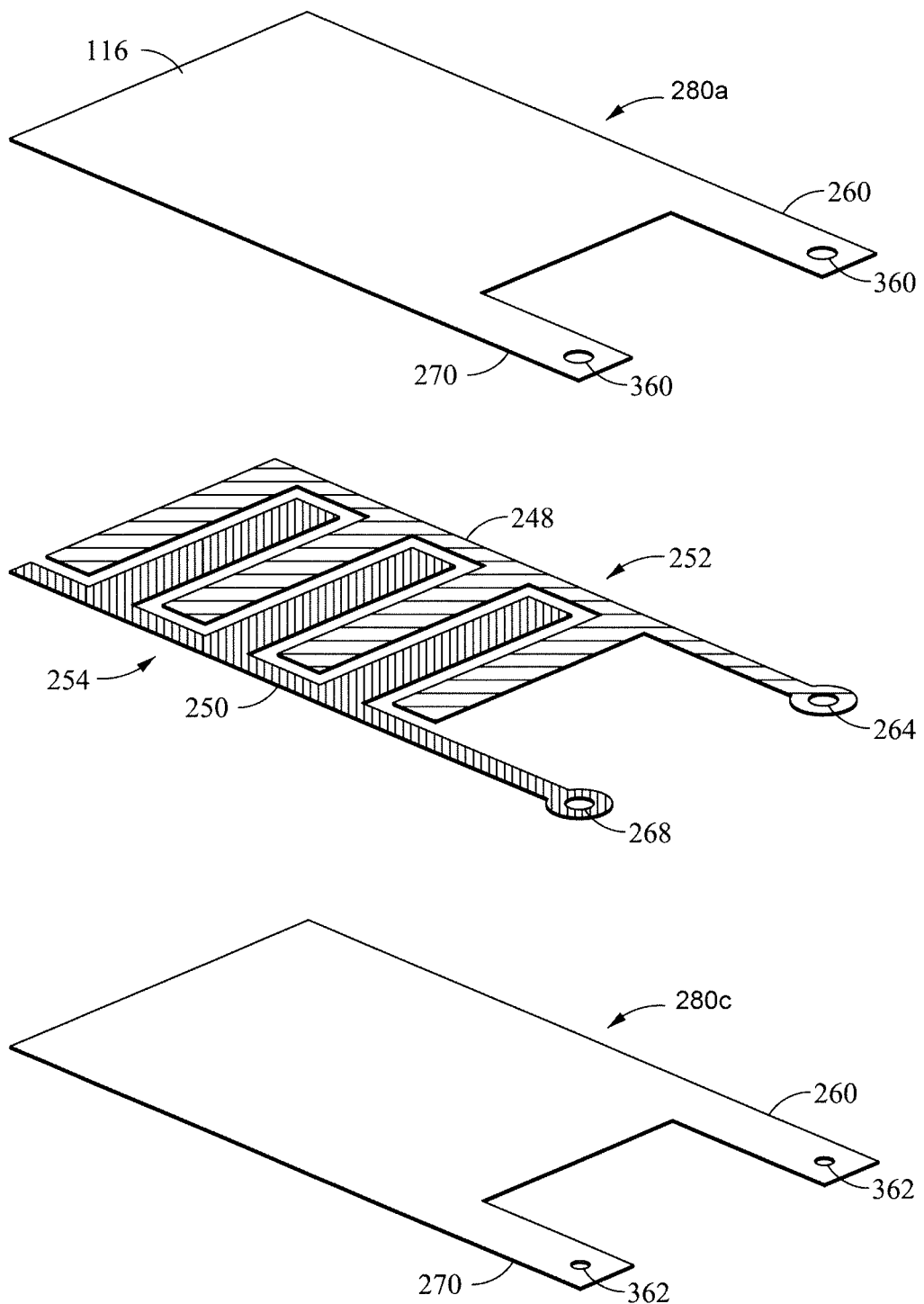

As illustrated in FIG. 3B, the electrode segments 252 and 254 of electrodes 248 and 250 are disposed on a common surface of a common dielectric sheet. For example, the electrode segments 252 and 254 of electrodes 248 and 250 may be disposed on a common side of dielectric sheet 280a and or 280c. In various embodiments, the electrode segments 252 and 254 of electrodes 248 and 250 may be disposed on an additional dielectric sheet not illustrated. In an embodiment, the electrode segments 252 and 254 of electrodes 248 and 250 may be disposed on a common side of dielectric sheet 280c illustrated in FIG. 3B.

The first tab 260 includes a first connection terminal 264 coupled thereto, while the second tab 270 includes a second connection terminal 268 coupled thereto. The first connection terminal 264 is electrically coupled to the first electrode 248 while the second connection terminal 268 is electrically coupled to the second electrode 250. Each tab 260, 270 is folded or bent out of the planes of the first electrode 248 and the second electrode 250 (for example along line 262) to allow the tabs 260, 270 to penetrate the chuck body 108 (shown in FIG. 1) and optionally the carrier body 106 through the aperture 172 in the base plate 132 to a location that facilitates electrical connection to a power source. The tabs 260, 270 may be spaced to allow the tabs 260, 270 of one electrostatic chuck panel 102 to interleave with the tabs 260, 270 of an adjacent electrostatic chuck panel 102 upon assembly to the ESC 104.

Each of the electrostatic chuck panels 102 in the ESC 104 may be individually controllable to enable fine tuning of the chucking force provided within a desired region of the ESC 104. Similarly, groups of electrostatic chuck panels 102, for example, three electrostatic chuck panels 102, may be controllable together. It is contemplated that any number of electrostatic chuck panels 102 may be controllable together in any desired pattern or combination. The individual or group control of the electrostatic chuck panels 102 within the ESC 104 may be controlled by control electronics 256 and may be adapted to chuck various types of substrates to the substrate carrier 100. Optionally, only a first group of the electrostatic chuck panels 102 may be powered to secure a substrate to the ESC 104, thereby allowing a second group of the electrostatic chuck panels 102 to function as spare or backup chuck, only energized as needed should one or more of the electrostatic chuck panels 102 of the first group fail. For example, once it has been determined that one or more of the electrostatic chuck panels 102 of a first group initially utilized to secure a first substrate have failed, one or more of the electrostatic chuck panels 102 of a second group initially not energized while the first group is utilized to secure a second substrate may be energized as part of the first group to secure substrates to the ESC 104.

The one or more power sources 258 is electrically coupled to the electrodes 248, 250 of the electrostatic chuck panels 102 and configured to provide chucking or de-chucking power to the electrostatic chuck panels 102 when desired. The one or more power sources 258 may also be in electrical communication with control electronics 256. As such, the control electronics 256 may be adapted to control the delivery of electrical signals from the one or more power sources 258 independently and selectively to the each of the electrostatic chuck panels 102.

The ESC 104 may include between about 6 and about 500 or more electrostatic chuck panels 102, for example, between about 200 and about 300 electrostatic chuck panels 102. In one embodiment, the ESC 104 has about 225 electrostatic chuck panels 102 arranged in a 2-D array. In another embodiment, the ESC 104 has about 75 groups of three electrostatic chuck panels 102. Although shown as arranged in a grid-like pattern, the ESC array 202 may be configured in any shape or pattern to accommodate desired chucking capabilities.

The electrostatic chuck panels 102 included in the ESC 104 are depicted as having a generally square or rectangular shape; however, it is contemplated that the electrostatic chuck panels 102 may have other shapes. In one embodiment, a width 212 of an electrostatic chuck panel 102, excluding the tab 260, may be between about 200 mm and about 500 mm, such as between about 300 mm and about 450 mm. A length 214 of the electrostatic chuck panel 102 may be between about 100 mm and about 300 mm, such as between about 200 mm and about 250 mm. The length 214 and width 212 may also have other sizes and shapes.

As previously described, the carrier body 106, which has the ESC 104 disposed thereon, may have the control electronics 256, one or more power sources 258, and optional translational member 120 coupled thereto. The carrier body 106 may be fabricated from a metal, such as aluminum, titanium, stainless steel, and alloys and combinations thereof. The carrier body 106 may be square shaped or rectangular shaped, however, it is contemplated that the carrier body 106 may have other shapes. In one embodiment, the carrier body 106 includes at least first and second regions which are fastened together. The first and second region may be separated by one or more thermal breaks 182 and fastened together using one or more bolts or similar fasteners. In one embodiment, the electrostatic chuck panels 102 are disposed on the first region of the carrier body and the gas and electronics cavities are disposed within the second region of the carrier body.

The one or more power sources 258, such as a battery or the like, may be coupled to the carrier body 106 and be configured to store and provide power to the ESC 104. In one embodiment, the one or more power sources 258 and the control electronics 256 are coupled to the carrier body 106 adjacent the ESC 104. In another embodiment, the one or more power sources 258 may be located remotely from the carrier body 106 but in electrical communication with the ESC 104 and the control electronics 256. For example, the one or more power sources 258 may be located within a processing chamber and may be electrically coupled to the ESC 104 and control electronics 256 when it is desirable to chuck and de-chuck a substrate from the substrate carrier 100 using quick disconnects, inductive coupling or other suitable technique In operation, one or more substrates may be placed in contact with the substrate carrier 100 and the control electronics 256 may cause the one or more power sources 258 to provide a chucking voltage having a first polarity to the electrodes 248 and a chucking voltage having a second polarity to the electrodes 250 in one or more electrostatic chuck panels 102 disposed within the ESC 104. The first polarity is opposite the second polarity. For example, the first polarity is opposite in sign to the second polarity. The ESC 104 chucks the substrate for a desired amount of time (i.e. during processing) and the control electronics 256 may then cause the one or more power sources 258 to provide a de-chucking voltage of the opposite polarities to de-chuck the substrate from the substrate carrier 100. In one embodiment, sensors disposed within the processing chamber may be in communication with the control electronics 256 and provide signals to the control electronics 256 when it is desirable to chuck and/or de-chuck the substrate. Although the one or more power sources 258 and the control electronics 256 are shown as being coupled to the carrier body 106 below the ESC 104, it is contemplated that the one or more power sources 258 and the control electronics 256 may be coupled to or disposed in the carrier body 106 at any desirable location, for example, above the ESC 104 or beside the ESC 104.

The optional translational member 120 may be coupled to the carrier body 106 by one or more coupling elements 207. The coupling elements 207 may be formed from a material similar to the materials utilized to form the body 106 or may be formed from various other materials. The coupling elements 207 extend from the body 106 and position the translational member 120 relative to the carrier body 106. The optional translational member 120 may be adapted to move within a processing chamber along a guide or the like. The optional translational member 120 may be rod-like and may have a circular or quadrilateral cross-section. In one embodiment, the optional translational member 120 and coupling elements 207 may be electrically conductive to provide electrical communication between the control electronics 256, the ESC 104, and the one or more power sources 258 if the power source is located remotely from the carrier body 106.

FIG. 3A is an exploded view of an embodiment of electrostatic chuck panels 102. The electrostatic chuck panel 102 includes a first dielectric sheet 280a, a second dielectric sheet 280b, and a third dielectric sheet 280c. The first electrode 248 is sandwiched between the first dielectric sheet 280a and the second dielectric sheet 280b. The second electrode 250 is sandwiched between the second dielectric sheet 280b and the third dielectric sheet 280c. The dielectric sheets 280a, 280b, 280c may be formed from an electrically insulating polymeric material, such as polyimide, or may also be formed from a polyaryletherketone or polyetheretherketone (PEEK) or ceramics. The dielectric sheets 280a, 280b, 280c may be held together by adhesive, thermal bonding or other suitable method.

The dielectric sheets 280a, 280b, 280c each include respective tabs 260 and 270. The tabs 260, 270 include openings 360 or 362 therein that expose the first connection terminal 264 and the second connection terminal 268. The openings are sized to allow a fastener therethrough to facilitate a desired electrical connection.

The segments 252, 254 include lengthwise edges 372, 374, respectively. Adjacent lengthwise edges 372, 374 are positioned to be coplanar with one another such that the horizontal distance between adjacent electrode segments 252, 254 is zero millimeters. In various embodiments, a lengthwise edge 372 is coplanar with an immediately adjacent lengthwise edge 374. In one or more embodiments, the plane of adjacent lengthwise edge 372, 374 is perpendicular to the plane of electrode segments 252 and/or electrode segments 254.

In one or more embodiments, an electrostatic chuck comprises a first electrode having a plurality of segments and a second electrode having a plurality of segments. Segments of the first electrode may be interleaved with segments of the second electrode. Further, in one embodiment, the segments of the first electrode and the segments of the second electrode are arranged in a spiral.

Figure 4A:
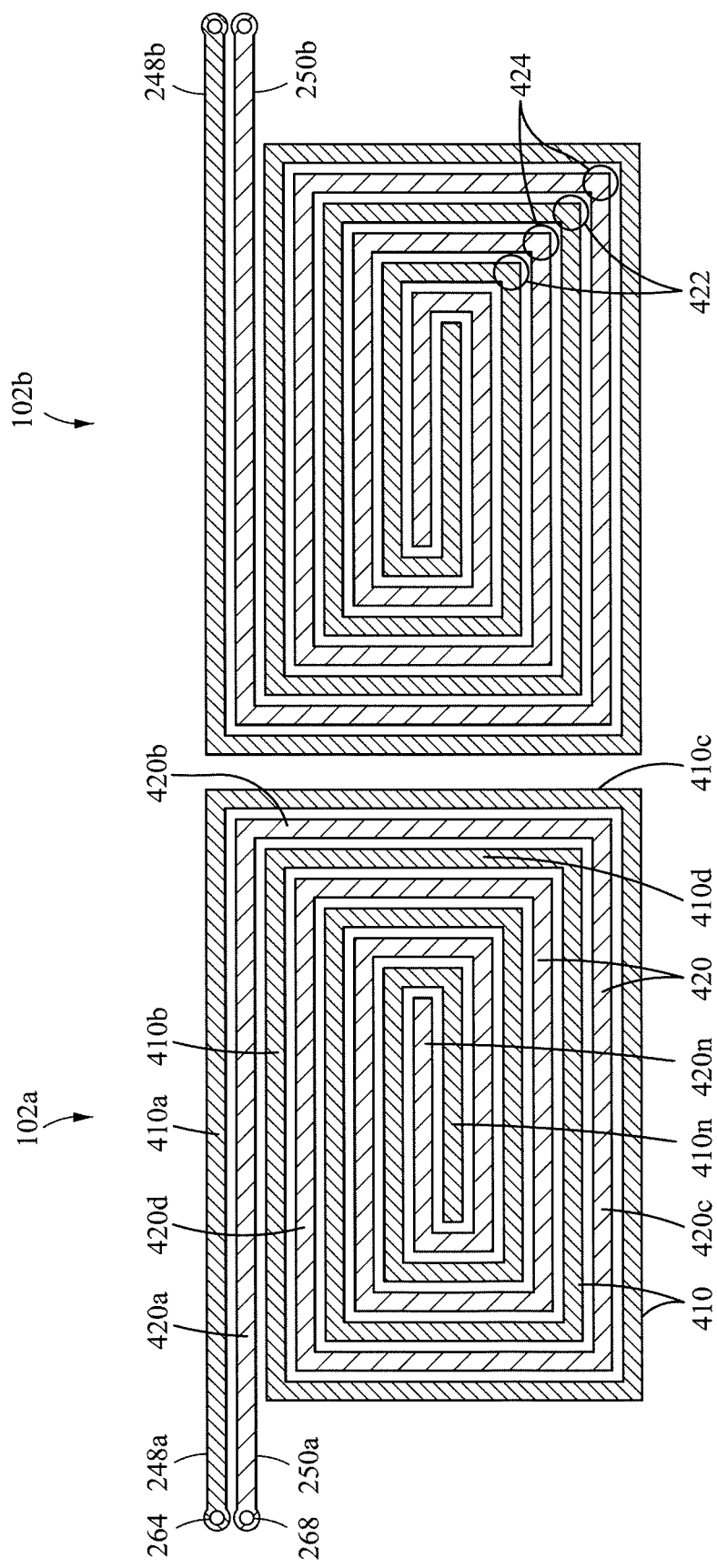
FIGS. 4A-4E illustrate exemplary electrostatic chuck panels of the ESC of FIG. 1.

FIG. 4A illustrates an alternative embodiment of electrostatic chuck panels 102. As illustrated, electrostatic chuck panel 102a comprises first electrode 248a and second electrode 250a and electrostatic chuck panel 102b comprises first electrode 248b and second electrode 250b. As illustrated, segments of the first and second electrodes are interleaved with each other and are arranged in a spiral.

Each of the first and second electrodes 248 and 250 has a plurality of segments. For example, the first electrodes 248 has a plurality of segments 410 (410a, 410b, 410c, 410d . . . 410n) and the second electrode 250 each has a plurality of segments 420 (420a, 420b, 420c, 420d . . . 420n). In various embodiments, one or more of the plurality of segments 420 are interleaved with one or more of the plurality of segments 410. For example, segment 420a of the plurality of segments 420 is disposed parallel to, adjacent to and between segments 410a and 410b of the plurality of segments 410. Further, segment 410b of the plurality of segments 410 is disposed parallel to, adjacent to and between segments 420a and 420d of plurality of segments 420. In various embodiments, the first electrode and second electrode may be disposed on separate layers. For example, the first and second electrodes may be disposed on different sides of a common dielectric layer, or on different dielectric layers. In other embodiments, the first and second electrodes are disposed on a common side of a dielectric layer, such that the corresponding segments are coplanar.

The segments 410 and 420 may be disposed such that the distance between adjacent segments may be substantially constant along the length of the shorter of the segments. For example, the distance between segment 410a and 420a may be substantially constant along the length of segment 420a as segment 420a is shorter than segment 410a. In other embodiment, the distance between one or more segments of segments 410 and one or more segments of segments 420 may vary along the length of one of the segments. For example, the distance between segment 410a and segment 420a may vary along the length of segment 420a.

In various embodiments, subsequent segments of the plurality of segments 410 connect at a corner (e.g., corners 422) and are disposed perpendicular to each other. For example, segments 410c and 410a connect at a first corner of corners 422 and segments 410c and 410a are disposed perpendicular to each other.

Chucking electrodes 248 and 250 include a plurality of corners. For example, a first chucking electrode includes corners 422 and a second chucking electrode includes corners 424. Each corner forms a connecting region between segments of a corresponding chucking electrode. In one embodiment, a first segment of segments 410 is disposed perpendicular to a second segment of segments 410 and connect at respective ones of corners 422. Additionally, a first segment of segments 420 is disposed perpendicular to a second segment of segments 420 and connect at respective ones corner of corners 424.

In various embodiments, subsequent segments of the plurality of segments 420 connect at a corner (e.g., corners 424) and are disposed perpendicular to each other. For example, segments 420a and 420b connect at a first corner of corners 424 and segments 420a and 420b are disposed perpendicular to each other As is illustrated, the corners of the electrode segments may be disposed between each other. For example, corner 422 is disposed between corners 424.

The plurality of segments (e.g., 410 or 420) may be have disposed within various patterns in shapes. Further, electrodes 248 and 250 have the same number of segments. In other embodiments, one of the electrodes 248 and 250 has at least one more segment than the other electrode.

The segments 410 and 420 for each electrode 248 and 250 are generally disposed on or between one or more dielectric sheets. One or more of the dielectric sheets include at least one or more tabs extending from a side of the dielectric sheet. The tabs may extend from the same side or from opposite or adjacent sides of the dielectric sheets. In one embodiment, connection terminals 264 and 268 are disposed on tabs of the one or more dielectric sheets.

In various embodiments, the chucking electrodes 248 and the chucking electrodes 250 are energized in a bipolar manner. For example, the chucking electrode 248a may be driven with a chucking voltage having a first polarity and the chucking electrode 250a may be driven with a chucking voltage having a second polarity. Further, the chucking electrode 248b may be driven with a chucking voltage having the first polarity and the chucking electrode 250b may be driven with a chucking voltage having the second polarity. The first polarity is opposite the second polarity. For the example, the first and second polarities may differ in sign. In one embodiment, the chucking electrode 248b is driven with a chucking voltage having the second polarity and the chucking electrode 250b is driven with a chucking voltage having the first polarity FIGS. 4B-4E illustrate various embodiments of chucking electrodes 248 and 250 having modified corners with different shapes. While the corner shapes are shown for a chucking electrode having segments arranged in a spiral, the corner modifications may be applied to other segment arrangements. For example, the corner modifications may be applied to the chucking electrodes of FIGS. 3A and 3B.

Figure 4B:
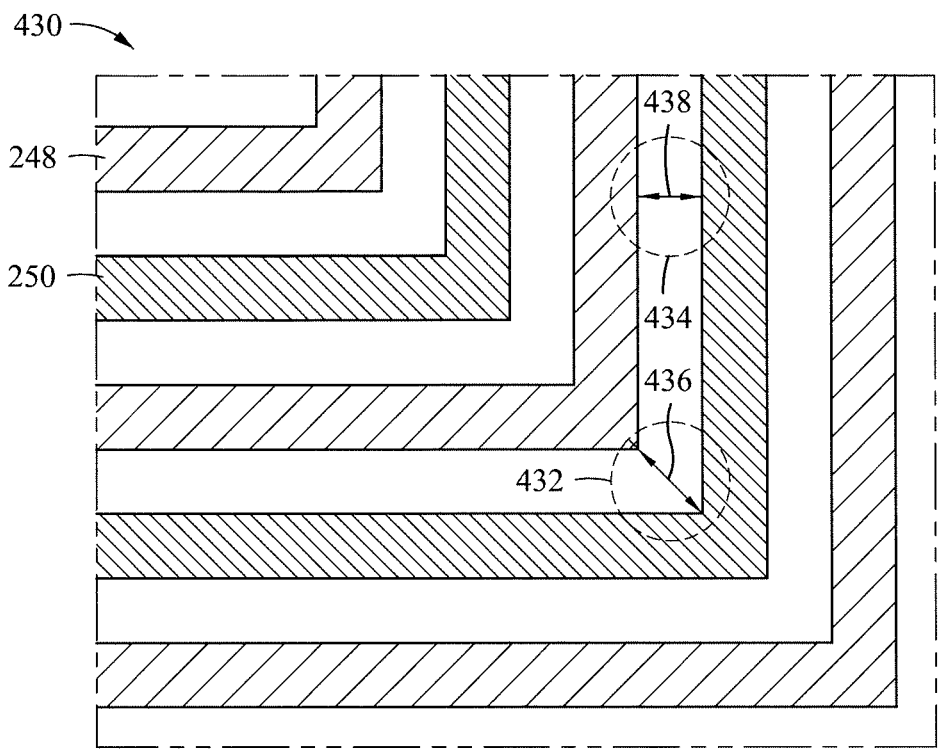

As is shown in detail 430 of FIG. 4B, the distance 436 between segments at corner 432 differs from the distance 438 between adjacent segments of electrodes 250 and 248. As such, non-uniformities in the residual electrostatic field on the surface of the substrate may exist between corner 432 and region 434 due to the varying distance between electrodes. However, the non-uniformities may be reduced or eliminated by reducing the difference between distances 436 and 438. For example, by rounding at least one side of one of the segments in the corner regions, the distance between electrodes in corners may be made similar to the distance between electrodes in the other regions.

Figure 4C:
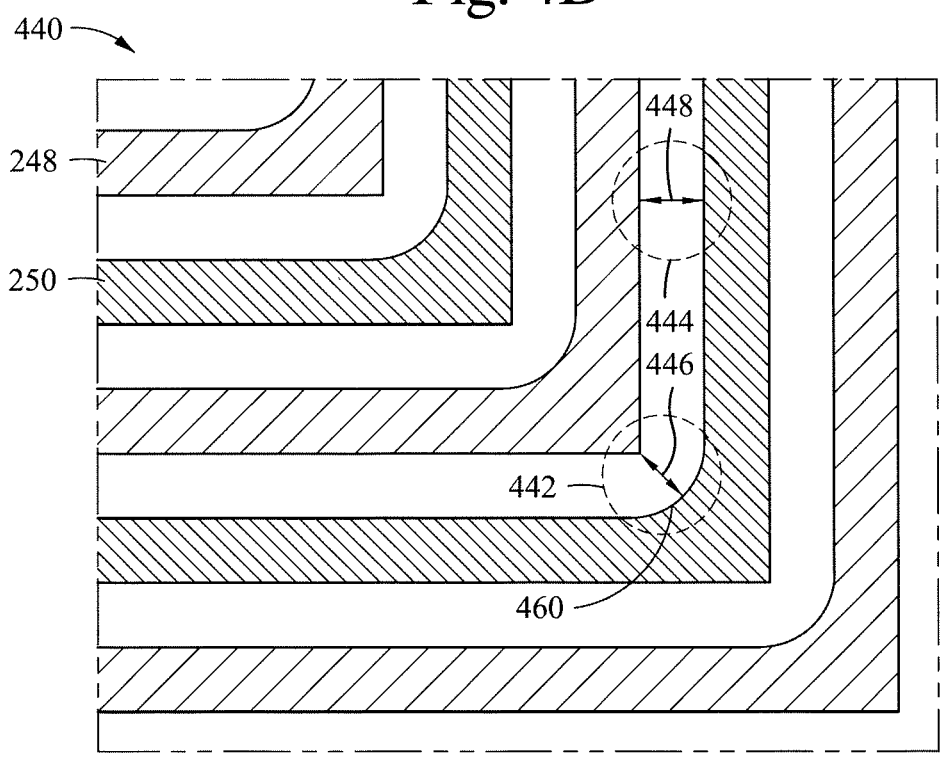

In the embodiment of FIG. 4C, detail 440 illustrates corner 442 including at least one rounded side as indicated by 460. As such, the difference between distance 446 and 448 in corner 442 and region 444 respectively is less than the difference between distance 436 and 438. Moreover, the residual electrostatic field distribution of detail 440 has a higher uniformity than the residual electrostatic field distribution of detail 430.

Figure 4D:
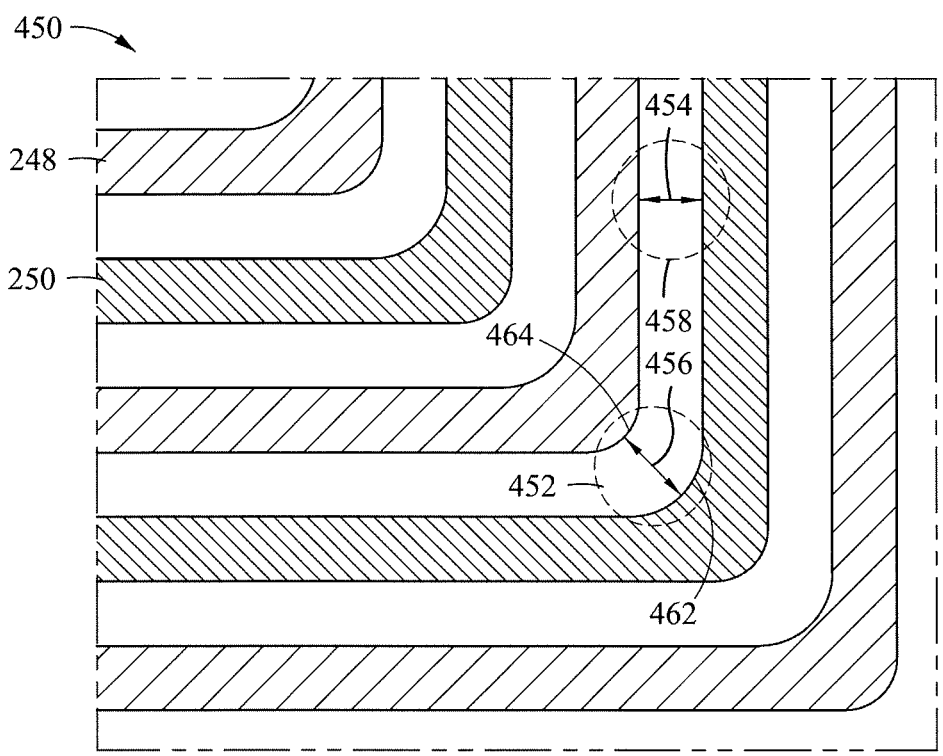

Detail 450 of FIG. 4D illustrates another embodiment of chucking electrodes 248 and 250. As illustrated by detail 450, the corner 452 includes rounded sides 462 and 464, having a first radius and second radius, respectively. In the illustrated embodiment, the radius of side 464 is smaller than the radius of side 462. In other embodiments, the radius of side 464 and the radius of side 462 are equal to each other. In yet other embodiments, the radius of side 464 is greater than the radius of side 462. In embodiments where the radius of each of the sides are at least substantially similar, the distance 456 between segments of electrode 248 and electrode 250 in corner 452 is substantially similar to the distance 454 between segments of electrode 248 and electrode 250 in region 458. As such, the distance between the segments of electrodes 248 and 250 is substantially constant across the electrostatic chuck panel. Thus, the residual electrostatic field distribution of detail 450 has a higher uniformity than the residual electrostatic field distributions of details 440 and 430.

Figure 4E:
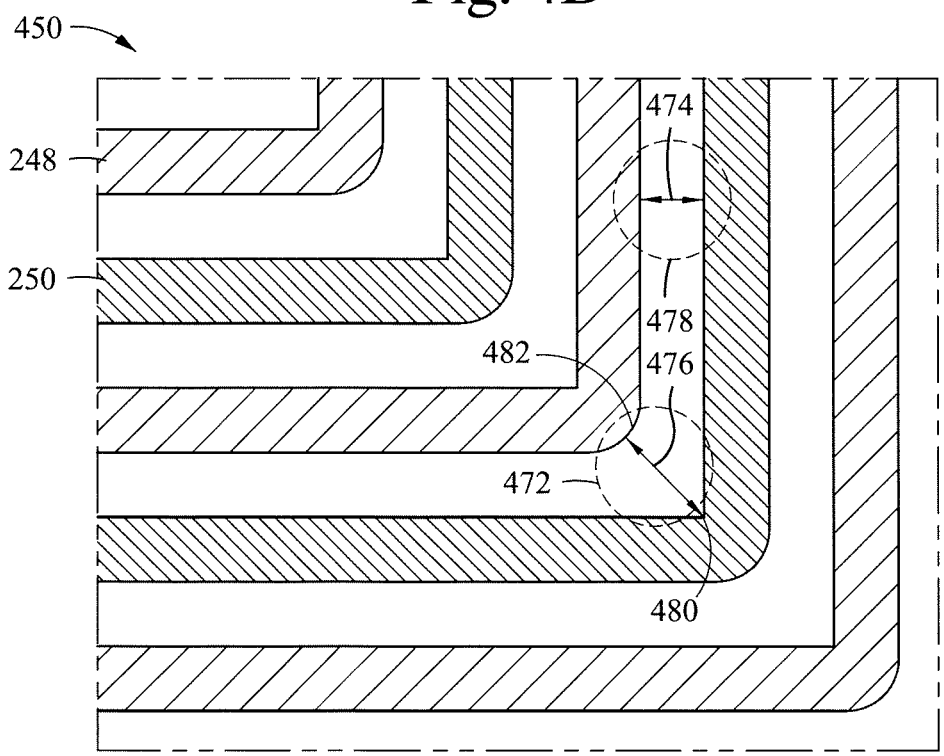

In the embodiment of FIG. 4E, detail 470 illustrates corner 472 including rounded side 482 and side 480 which is not rounded. As such, the difference between distance 476 of corner 472 and distance 474 in region 478 is more than the difference between distance 436 and 438.

Figure 4F:
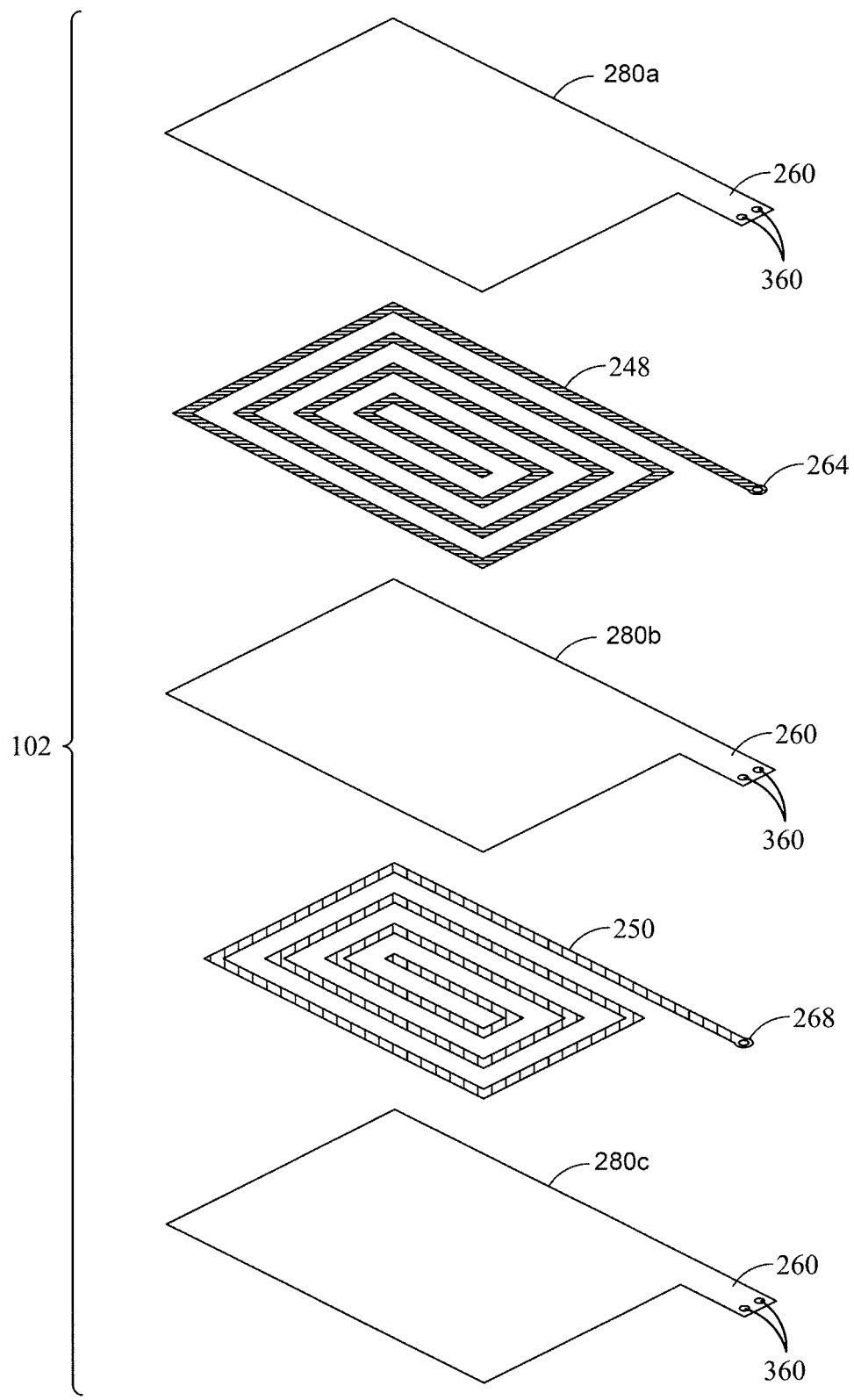
FIGS. 4F and 4G illustrate a schematic exploded view of an electrostatic chuck panel of the ESC of FIG. 1.
Figure 4G:
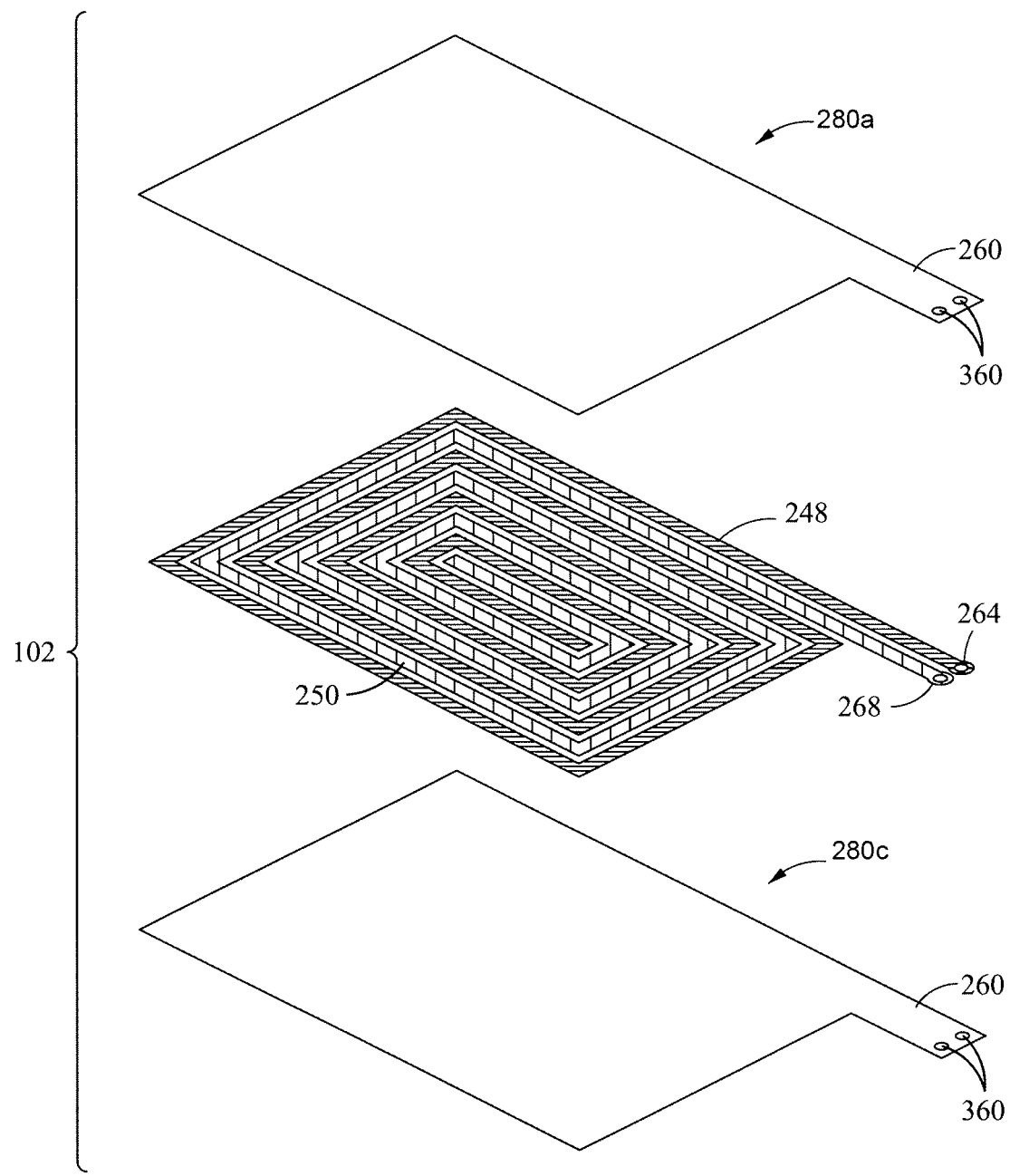

FIGS. 4F and 4G illustrate exploded views of an electrostatic chuck panel 102 comprising electrodes 248 and 250. As illustrated in FIGS. 4F and 4G, the electrode segments are formed in a spiral. In the embodiment of FIG. 4F, electrode 248 is separated from electrode 250 by a dielectric sheet. In one embodiment, electrode 248 is disposed on a first side of dielectric sheet 280b and electrode 250 is disposed on a second side of dielectric sheet 280b. In another embodiment, electrode 248 is disposed on a first dielectric sheet and electrode 250 is disposed on a second dielectric sheet. In one embodiment, the width of the electrode segments of electrode 248 is similar to the width of the electrode segments of electrode 250. For example, the electrode segments may have a width of about 0.25 mm. In another embodiment, the width of the electrode segments of electrode 248 is less than the width of the electrode segments of electrode 250. For example, the electrode segments of electrode 248 may have a width of 0.25 mm and the electrode segments of electrode 250 may have a width of about 0.50 mm. Further, the spacing between electrode segments of electrodes 248 and 250 may be 0 mm.

In the embodiment of FIG. 4G, electrodes 248 and 250 may be disposed within a common layer of dielectric sheet. For example, the electrodes 248 and 250 may be disposed on a common side of a dielectric sheet (dielectric sheet 280c, 280a, or 280b (not illustrated). Further, the electrode segments of electrodes 248 and 250 may have a similar width or may differ in width. In one embodiment, the width of the electrode segments about 0.25 mm. Additionally, the spacing between the electrode segments may be about 0.25 mm.

Figure 5A:
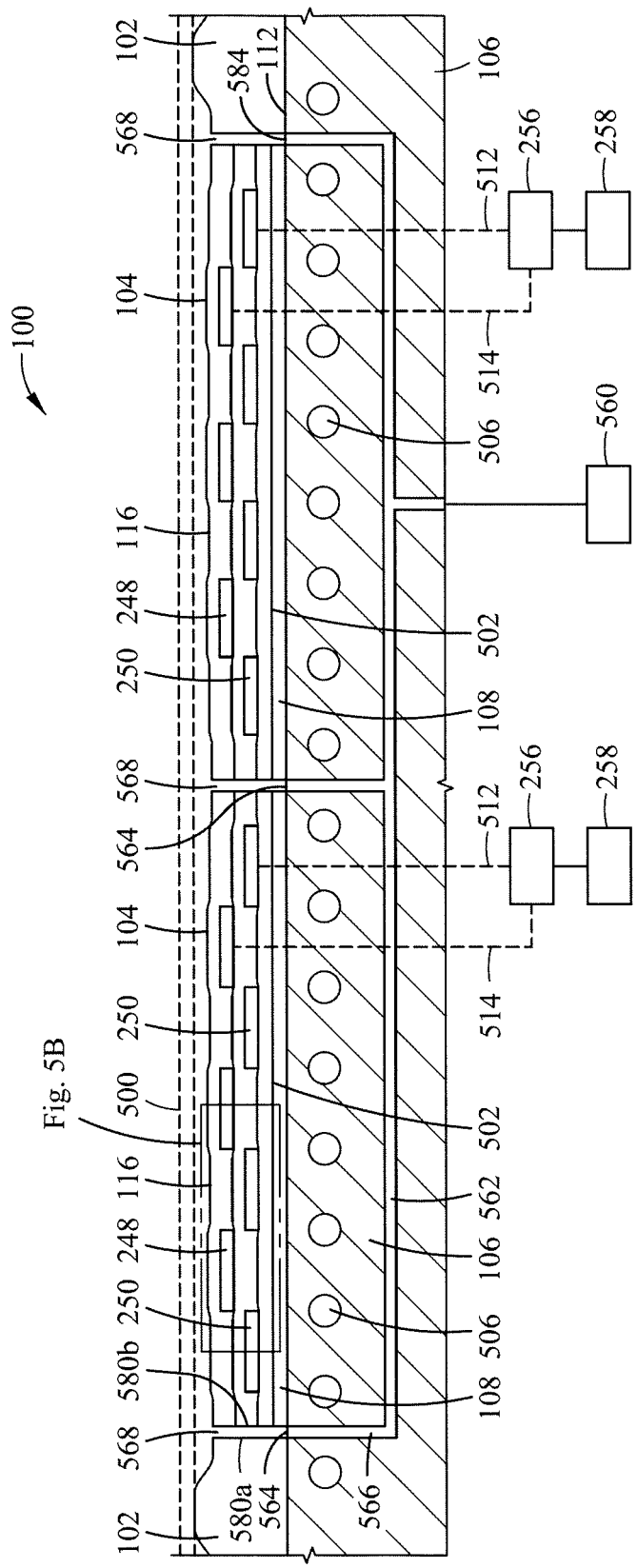
FIG. 5A is a partial schematic cross-sectional view of the substrate carrier illustrating adjacent electrostatic chuck panels.

FIG. 5A is a partial cross-sectional view of the substrate carrier 100 illustrating adjacent electrostatic chuck panels 102. A substrate 500 is shown in phantom disposed on the substrate support surface 116 of the electrostatic chuck panels 102. The substrate 500 may be configured as described above. The electrostatic chuck panels 102 may be mounted to an upper surface 502 of the chuck body 108 (if present) utilizing pressure sensitive adhesive, or other suitable method. The electrostatic chuck panels 102 (and chuck body 108, if present) may be mounted to the carrier body 106 utilizing pressure sensitive adhesive, or other suitable method. The first and second electrodes 248, 250 of each electrostatic chuck panel 102 are coupled to the control electronics 256 and one or more power sources 258 by electrical leads 512, 514.

Continuing to refer to FIG. 5A, facing edges 580a and 580b of two or more adjacent electrostatic chuck panels 102 are spaced apart thereby forming a gap 568 between the electrostatic chuck panels 102. There optionally may be no gaps 568 present between selected other adjacent electrostatic chuck panels 102. The gaps 568 form gas channels between the electrostatic chuck panels 102 across the substrate support surface 116 of the ESC 104. By selecting between which electrostatic chuck panels 102 have gaps 568 and do not have gaps 568, a pattern of gas channels may be formed across the substrate support surface 116. The gas channels defined by the gaps 568 may be flooded with a backside gas, such as helium or Argon, to improve heat transfer between the ESC 104 and the substrate 500 secured thereto.

The carrier body 106 includes one or more ports 564 that are coupled though passages 566, 562 formed through the carrier body 106 to a backside gas source 560. The backside gas source 560 may be disposed inside the carrier body 106, or temporarily coupled thereto while in a processing chamber, for example using a quick connect or other fitting (not shown).

The one or more ports 564 are aligned with the gaps 568 forming the gas channels between the electrostatic chuck panels 102. Thus, backside gas, such as helium, may be provided from backside gas source 560 through the ports 564 and into the gaps 568 to enhance temperature control of the substrate 500. As the gas channels are formed by the gaps 568 defined between the electrostatic chuck panels 102, separate gas channels do not have to be formed in the substrate support surface 116, thereby reducing fabrication costs. Additionally, as the electrostatic chuck panels 102 may be repositioned on the carrier body 106 to reconfigure the pattern of gas channels defined by the gaps 568, the heat transfer characteristics of the ESC 104 may be easily modified to tailor heat transfer needs to specific applications without having to replace major portions of the ESC 104.

To further enhance heat transfer between the ESC 104 and the carrier body 106 and ultimately with the substrate 500, the carrier body 106 may optionally include conduits 506 disposed therein for carrying a heat transfer fluid. The conduits 506 are arranged in a pattern laterally across the carrier body 106 (i.e., parallel to a plane of the ESC 104). The heat transfer fluid may reside in the conduits 506 or be circulated therethrough. In one example, the heat transfer fluid provided from a fluid source (not shown) is circulated in the conduits 506. In another example, the heat transfer fluid sealingly contained the conduits 506 while substrate 500 is secured to the substrate carrier 100. The fluid source may be disposed inside the carrier body 106, or temporarily coupled thereto, for example using a quick connect or other fitting (not shown), for flowing or exchanging the heat transfer fluid.

Figure 5B:
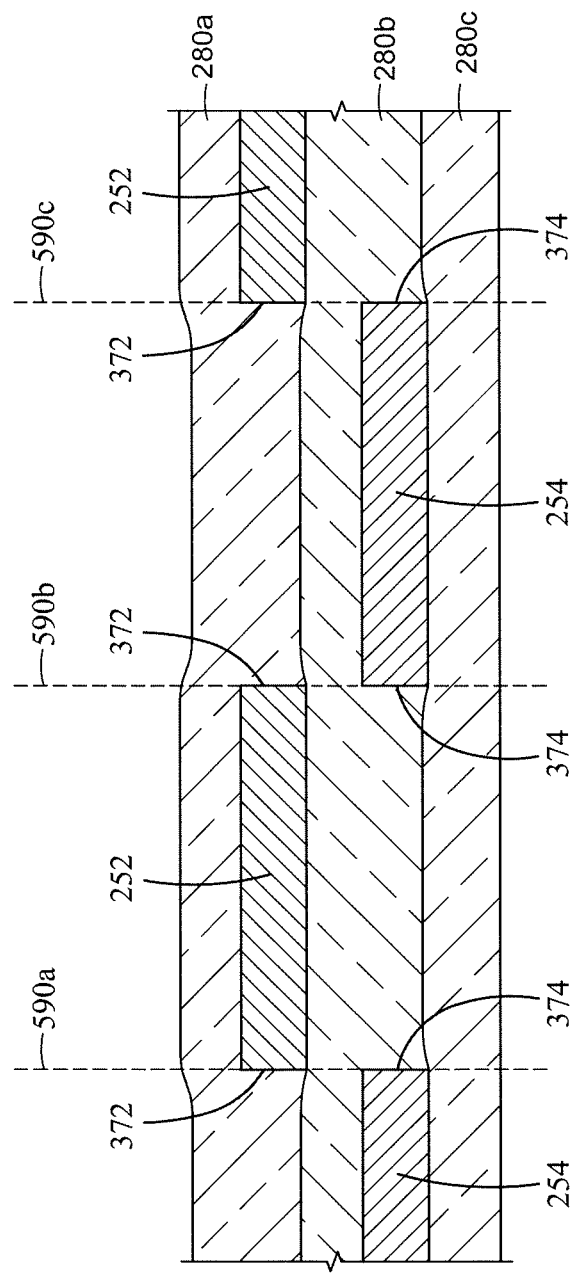
FIGS. 5B-5C are enlarged schematic partial views of FIG. 5A.

FIG. 5B is an enlarged schematic partial view of FIG. 5A. FIG. 5B illustrates alignment of the electrode segments 252 and 254, of chucking electrodes 248 and 250, respectively. As illustrated, the edges 372 of the electrode segments 252 are aligned with the edges 374 of the electrode segment 254 in respective planes 590a, 590b, 590c. Stated otherwise, the horizontal distance between the electrode segments 252, 254 is zero millimeters. The alignment of the electrode segments 252, 254 facilitates a very high chucking force and uniform chucking of a substrate during processing, thereby improving processing uniformity. In one example, the planes 590a, 590b, 590c are parallel to one another and perpendicular to a plane of the first electrode 248 and/or to a plane of the second electrode 250.

To further facilitate uniform processing and to obtain close to zero residual electrostatic field on the top surface of the substrate, the back or lower electrode 250 having segments 254, e.g., the electrode furthest from a substrate during processing, may have an absolute voltage applied thereto that is greater than the voltage applied to the first electrode 248 having segments 252. For example, the first electrode segments 252 may have a voltage of about −1000 volts applied thereto, while second electrode segments 254 may have a voltage of about +2500 volts applied thereto. In another example, the second (or bottom) electrode segments 254 may have an absolute voltage applied thereto that is about 1.5 to about 3 times the voltage of the first (or top) electrode segments 252, such as about 2 times to about 2.5 times the voltage of the first electrode segments 252. While the examples illustrate the first electrode segments 252 being negatively biased and the second electrode segments 254 as being positively biased, it is to be noted that the converse is also contemplated. Further, the asymmetric application of chucking voltage achieves at least about zero residual electrostatic field on the top surface of a substrate, thus the electronics devices such as TFT (Thin Film Transistors) formed on the top surface of the substrate are not affected during processing.

The difference in absolute bias compensates for the different distances of each electrode 248, 250 from the substrate that is electrostatically chucked. The offset distances of each electrode 248, 250 allow the width of respective electrode segments 252, 254 to extend a sufficient distance such that adjacent edges of segments 252, 254 are coplanar. By driving the electrodes with asymmetric electrode voltages, electric field may be made more uniform in the thickness of the substrate hence providing high and uniform chucking force and, at the same time, producing zero residual electrostatic field on surface of a substrate disposed over the chucking electrodes.

Figure 5C:
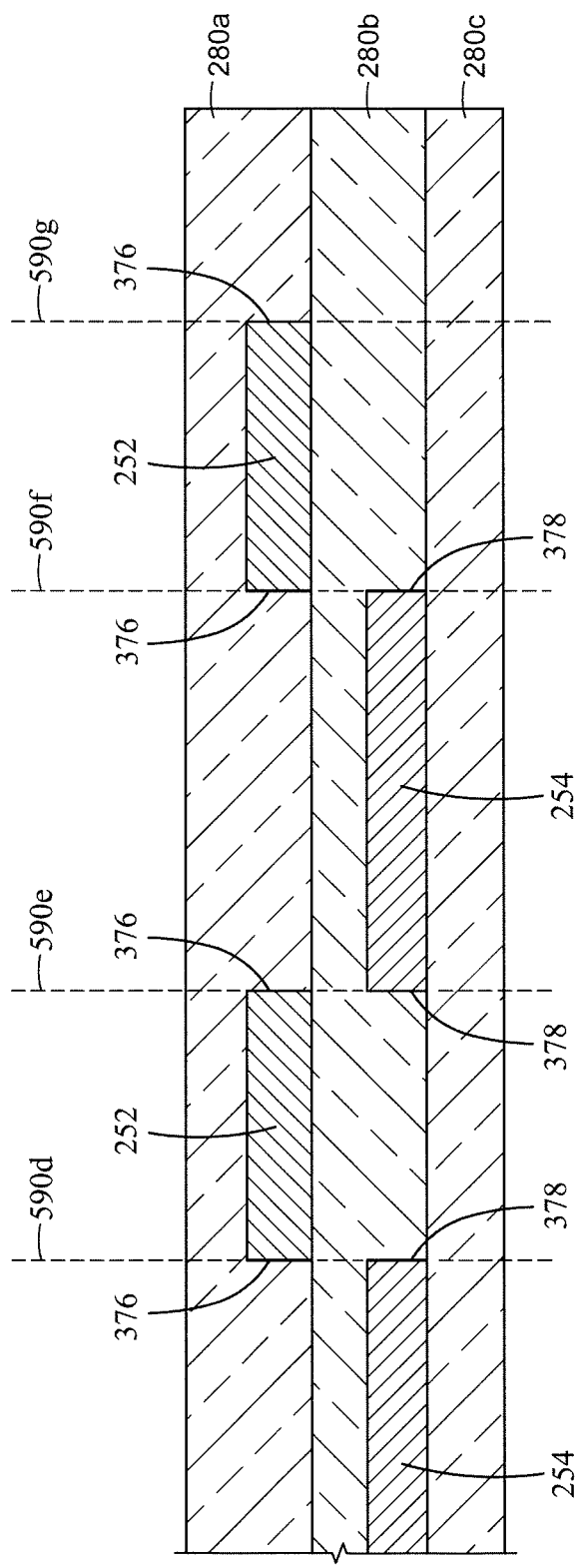

FIG. 5C is another embodiment of an enlarged schematic partial view of FIG. 5A. Specifically, FIG. 5C illustrates another embodiment of an alignment of the electrode segments 252 and 254. As illustrated, the edges 376 of the electrode segments 252 are aligned with the edges 378 of the electrode segment 254 in respective planes 590d, 590e, and 590f. As with the embodiment of FIG. 5B, the horizontal distance between the electrode segments 252, 254 is zero millimeters. The alignment of the electrode segments 252, 254 facilitates a very high chucking force and a uniform chucking of a substrate during processing, thereby improving processing uniformity. In one example, the planes 590d, 590e, 590f are parallel to one another and perpendicular to a plane of the first electrode 248 and/or to a plane of the second electrode 250.

The width of electrode segments 254 is greater than that of electrode segments 252. In one embodiment, the width of electrode segments 254 is at about two times that of electrode segments 252. In other embodiments, the width of electrode segments 254 may be greater than two times width of electrode segments 252 or less than two times the width of electrode segments 252.

To further facilitate uniform processing and to reduce the residual electrostatic field close to zero on the top surface of a substrate, the back or lower electrode segments 254, e.g., the electrode segments furthest from a substrate during processing, may have an absolute voltage applied thereto that is similar to that of the voltage applied to the first or upper electrode segments 252. For example, the first electrode segments 252 may have a voltage of about −1500 volts applied thereto, while second electrode segments 254 may have a voltage of about 1500 volts applied thereto. While the examples illustrate the first electrode segments 252 being negatively biased and the second electrode segments 254 being positively biased, it is to be noted that the converse is also contemplated.

In one or more embodiments, the width of the electrode segments 254 is twice the width of electrode segments 252. For example, an ESC may a first electrode with electrode segments having a width of about 0.25 mm and a second electrode with electrode segments having a width of 0.5 mm. In other embodiments, the first electrode segments and the second electrode segments have other widths such that the width of electrode segments 254 is greater than that of electrode segments 252.

Figure 6:
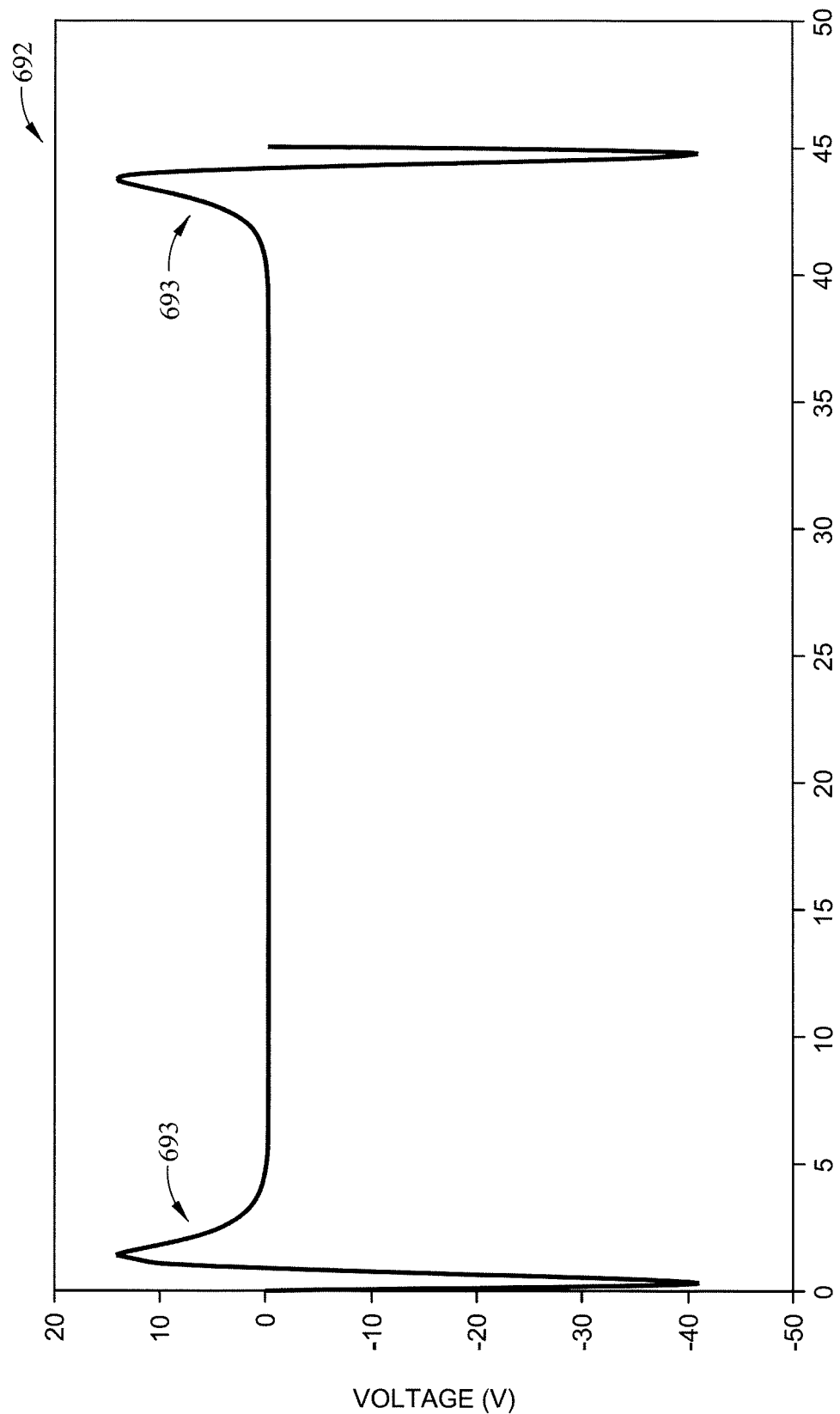
FIG. 6 is a graph illustrating the residual electrostatic field on the top surface of the substrate according one or more embodiments.

FIG. 6 is a graph 692 illustrating a distribution of residual electrostatic field on the top surface of a substrate across an ESC of the present disclosure. An ESC having upper (or first) electrode width as 0.25 mm and lower (second) electrode width as 0.5 mm and electrode spacing of 0 mm was used to chuck a glass substrate having a thickness of 0.3 mm. A DC voltage of −1000 was applied to the first (or upper) electrode, and a voltage of DC +1000 was applied to the second (or lower) electrode. The central portion of the graph 692 illustrates the almost close to zero residual electrostatic field on the top surface of the substrate. The central portion is uniform as each segment of first electrode has a segment of the second electrode on either side, and conversely each segment of the second electrode has a segment of the first electrode on either side, thus balancing the residual electrostatic field across the central region. The non-uniform ends 693 result due to the fact that either a positive or a negative electrode segment is disposed as the outermost electrode portion of a electrostatic chuck panel and hence has no segments of the opposite polarity bounding only the inner side. Therefore the last segment is unbalanced resulting in a voltage spike. However, the electrostatic chuck panels may be positioned in an array which mitigates this effect on substrate processing. For example, electrostatic chuck panels may be positioned in such a manner that non-uniform ends occur beyond the outer perimeter of a substrate, or occur at unused portions of the substrate which are considered as edge exclusion areas. Further, in the central portion, electrostatic chuck panels may be positioned such that a segment of a first electrostatic chuck panel driven with a chucking voltage having a first polarity is positioned adjacent to a segment of a second electrostatic chuck panel driven with a chucking voltage having a second polarity, where the first polarity is opposite that of the second polarity.

Figure 7:
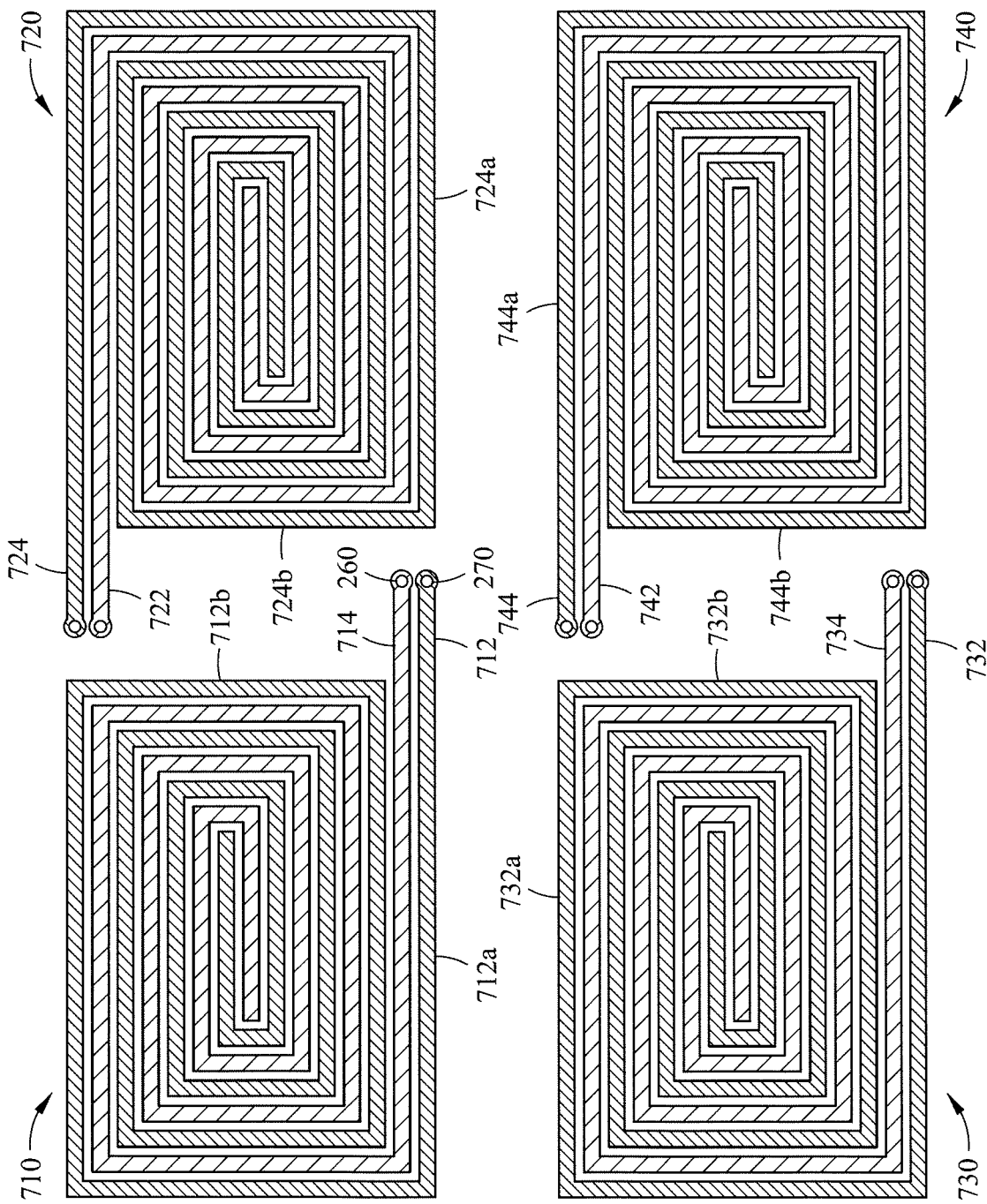
FIGS. 7 and 8 illustrate an electrostatic chuck panel layout according of one or more embodiments.

FIG. 7 schematically illustrates an array of electrostatic chuck panels 710, 720, 730 and 740 according to one or more embodiments. As illustrated, each of the electrostatic chuck panels includes a first electrode and a second electrode. For example, electrostatic chuck panel 710 includes electrodes 712 and 714, electrostatic chuck panel 720 includes electrodes 722 and 724, electrostatic chuck panel 730 includes electrodes 732 and 734, and electrostatic chuck panel 740 includes electrodes 742 and 744. Further, each chucking electrode includes a tab (e.g., tab 260 and 270). As is described above, each tab 260, 270 may be folded or bent out of the planes of the corresponding electrodes to allow the tabs 260, 270 to penetrate the chuck body 108 (shown in FIG. 1) and optionally the carrier body 106 through the apertures 172 in the base plate 132 to a location that facilitates electrical connection to a power source. Further, the tabs may be disposed at any position along the corresponding electrodes.

In one embodiment, the distance between adjacent electrodes of adjacent electrostatic chuck panels is similar the distance between electrodes of an electrostatic cuck assembly. For example, the distance between electrode 712 of electrostatic chuck panel 710 and electrode 724 of electrostatic chuck panel 720 is similar to the distance between electrodes 712 and 714 of electrostatic chuck panel 710. In another embodiment, the distance between adjacent electrodes of adjacent electrostatic chuck panels is less than three times the distance between electrodes of an electrostatic cuck assembly. For example, the distance between electrode 712 of electrostatic chuck panel 710 and electrode 724 of electrostatic chuck panel 720 is less than three times the distance between electrodes 712 and 714 of electrostatic chuck panel 710. Further, in yet another embodiment, the distance between adjacent electrodes of adjacent electrostatic chuck panels is less than six times the distance between electrodes of an electrostatic cuck assembly. For example, the distance between electrode 712 of electrostatic chuck panel 710 and electrode 724 of electrostatic chuck panel 720 is less than six times the distance between electrodes 712 and 714 of electrostatic chuck panel 710.

In an embodiment, adjacent electrodes within each electrostatic chuck panel are driven with chucking voltages having opposite polarities. For example, with reference to FIG. 7, electrodes 712 and 714 of electrostatic chuck panel 710 are driven with chucking voltages having opposite polarities. Further, in one or more embodiments, adjacent electrodes of adjacent electrostatic chuck panels are driven with chucking voltages having opposite polarities. For example, with further reference to FIG. 7, electrode 712 of electrostatic chuck panel 710 and electrode 724 of electrostatic chuck panel 720 are driven with chucking voltages having opposite polarities.

In one embodiment, the electrostatic chuck panels 710, 720, 730 and 740 are driven with one or more chucking voltages. For example, the electrostatic chuck panels 710, 720, 730 and 740 may be coupled to control electronics which may cause a power source to provide a first chucking voltage having a first polarity to a first electrode of each electrostatic chuck panel and a second chucking voltage having a second polarity to the other electrode of each electrostatic chuck panel. The first polarity is opposite that of the second polarity.

In one embodiment, electrode 712 of electrostatic chuck panel 710 is driven with a chucking voltage having a first polarity and electrode 714 of electrostatic chuck panel 710 is driven with a chucking voltage having a second polarity. In one embodiment, the first polarity may be positive and the second polarity may be negative. Further, in another embodiment, the first polarity may be negative and the second polarity may be positive.

In one or more embodiments, adjacent electrodes on adjacent electrostatic chuck panels are driven with chucking voltages having different polarities. In such embodiments, both the electrodes of the same electrostatic chuck panel are driven with chucking voltages having different polarities and adjacent electrodes of adjacent electrostatic chuck panels are driven with chucking voltages having different polarities to reduce residual electrostatic field formed on the top surface of a substrate between the electrostatic chuck panels. In various embodiments, the residual electrostatic field may be eliminated between the electrostatic chuck panels such that the edge effects illustrated in FIG. 6 are mitigated along the adjacent edges of the electrostatic chuck panels.

For example, electrode 712 of electrostatic chuck panel 710 is driven with a chucking voltage having a first polarity and electrode 732 of electrostatic chuck panel 730 is driving with a voltage having a second polarity. Accordingly, electrode segment 712*a* and electrode segment 732*a*, which are disposed adjacent to each other, are driven with chucking voltages having opposite polarities. Further, electrode 714 of electrostatic chuck panel 710 is driven with a chucking voltage having the second polarity and electrode 734 of electrostatic chuck panel 730 is driving with a voltage having the first polarity. Additionally, electrode 724 of electrostatic chuck panel 720 is driven with a chucking voltage having the second polarity and electrode 722 of electrostatic chuck panel 720 is driving with a voltage having the first polarity, and electrode 742 of electrostatic chuck panel 740 is driven with a chucking voltage having the second polarity and electrode 744 of electrostatic chuck panel 740 is driving with a voltage having the first polarity. Accordingly, electrode segment 712*b* and electrode segment 724*b* are driven with chucking voltages having opposite polarities, electrode segment 724*a* and electrode segment 744*a* are driven with chucking voltages having opposite polarities, and electrode segment 732*b* and electrode segment 744*b* are driven with chucking voltages having opposite polarities. The first polarity may be positive and the second polarity may be negative. In another embodiment, the first polarity may be negative and the second polarity may be positive.

Figure 8:
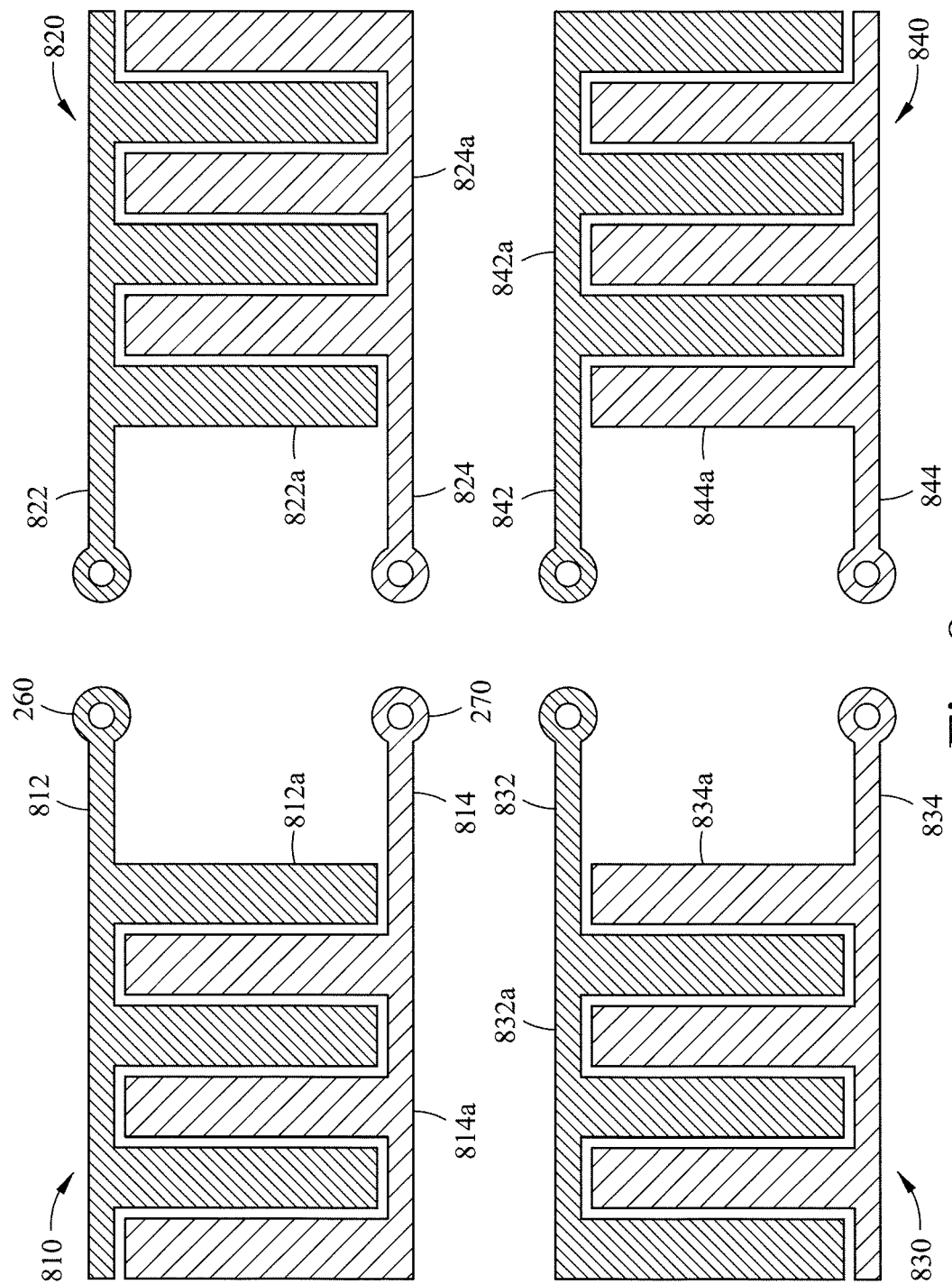

While the electrostatic chuck panels 710, 720, 730 and 740 are illustrated as having a spiral pattern with electrodes with multiple intertwined segments in other embodiment, the electrostatic chuck panels may having electrodes with different configurations and/or shapes. For example, FIG. 8 illustrates electrostatic chuck panels 810, 820, 830 and 840 with electrodes having interleaved segments (or fingers).

As illustrated, each of the electrostatic chuck panels includes a first and second electrode. For example, electrostatic chuck panel 810 includes electrodes 812 and 814, electrostatic chuck panel 820 includes electrodes 822 and 824, electrostatic chuck panel 830 includes electrodes 832 and 834, and electrostatic chuck panel 840 includes electrodes 842 and 844. In one or more embodiments, adjacent electrodes within an electrostatic chuck panel (e.g., electrostatic chuck panels 810, 820, 830, and/or 840) are driven with chucking voltages having opposite polarities. For example, with reference to FIG. 8, electrodes 812 and 814 of electrostatic chuck panel 810 are driven with chucking voltages having opposite polarities. Further, in one or more embodiments, adjacent electrodes of adjacent electrostatic chuck panels are driven with chucking voltages having opposite polarities. For example, electrode 812 of electrostatic chuck panel 810 and electrode 822 of electrostatic chuck panel 820 are driven with chucking voltages having opposite polarities.

In one embodiment, the distance between adjacent electrodes of adjacent electrostatic chuck panels is similar the distance between electrodes of an electrostatic cuck assembly. For example, the distance between electrode 812 of electrostatic chuck panel 810 and electrode 822 of electrostatic chuck panel 820 is similar to the distance between electrodes 812 and 814 of electrostatic chuck panel 810. In another embodiment, the distance between adjacent electrodes of adjacent electrostatic chuck panels is less than three times the distance between electrodes of an electrostatic cuck assembly. For example, the distance between electrode 812 of electrostatic chuck panel 810 and electrode 822 of electrostatic chuck panel 820 is less than three times the distance between electrodes 812 and 814 of electrostatic chuck panel 810. Further, in yet another embodiment, the distance between adjacent electrodes of adjacent electrostatic chuck panels is less than six times the distance between electrodes of an electrostatic cuck assembly. For example, the distance between electrode 812 of electrostatic chuck panel 810 and electrode 822 of electrostatic chuck panel 820 is less than six times the distance between electrodes 812 and 814 of electrostatic chuck panel 810.

The electrodes of electrostatic chuck panels 810, 820, 830 and 840 may be driven as described with regard to the embodiment of FIG. 7 such that adjacent electrodes of the same electrostatic chuck panel are driven with the chucking voltages having different polarities. Further, adjacent electrodes of adjacent electrostatic chuck panels are also driven with chucking voltages having different polarities to reduce the residual electrostatic field on the top surface of a substrate between electrostatic chuck panels. In various embodiments, the residual electrostatic field may be eliminated between the electrostatic assemblies such that the edge effects illustrated in FIG. 6 are mitigated along the adjacent edges of the electrostatic chuck panels.

In one or more embodiments, electrode 814 of electrostatic chuck panel 810 is driven with a chucking voltage having a first polarity and electrode 832 of electrostatic chuck panel 830 is driving with a voltage having a second polarity. Accordingly, electrode segment 814*a* and electrode segment 832*a*, which are disposed adjacent to each other, are driven with chucking voltages having opposite polarities. Further, electrode 812 of electrostatic chuck panel 810 is driven with a chucking voltage having the second polarity and electrode 834 of electrostatic chuck panel 830 is driving with a voltage having the first polarity. Additionally, electrode 822 of electrostatic chuck panel 820 is driven with a chucking voltage having the first polarity, electrode 824 of electrostatic chuck panel 820 is driving with a voltage having the second polarity, electrode 842 of electrostatic chuck panel 840 is driven with a chucking voltage having the first polarity, and electrode 844 of electrostatic chuck panel 840 is driving with a voltage having the second polarity. Accordingly, electrode segment 812*a* and electrode segment 822*a* are driven with chucking voltages having opposite polarities, electrode segment 824*a* and electrode segment 842*a* are driven with chucking voltages having opposite polarities, and electrode segment 844*a* and electrode segment 834*a* are driven with chucking voltages having opposite polarities. The first polarity may be positive and the second polarity may be negative. In another embodiment, the first polarity may be negative and the second polarity may be positive.

In various embodiments, the electrostatic chuck panels may have electrodes having different shapes and configured as to those illustrated in FIGS. 7 and 8. For example, the electrodes may have more or less segments. Further, the electrodes may have segments with different shapes and/or configurations. In one embodiment, each electrode only includes a single segment. In various embodiments, an electrode may have segments that are not interleaved with segments of another electrode. Further, the electrodes may have one or more curved or angled portions.

Figure 9:
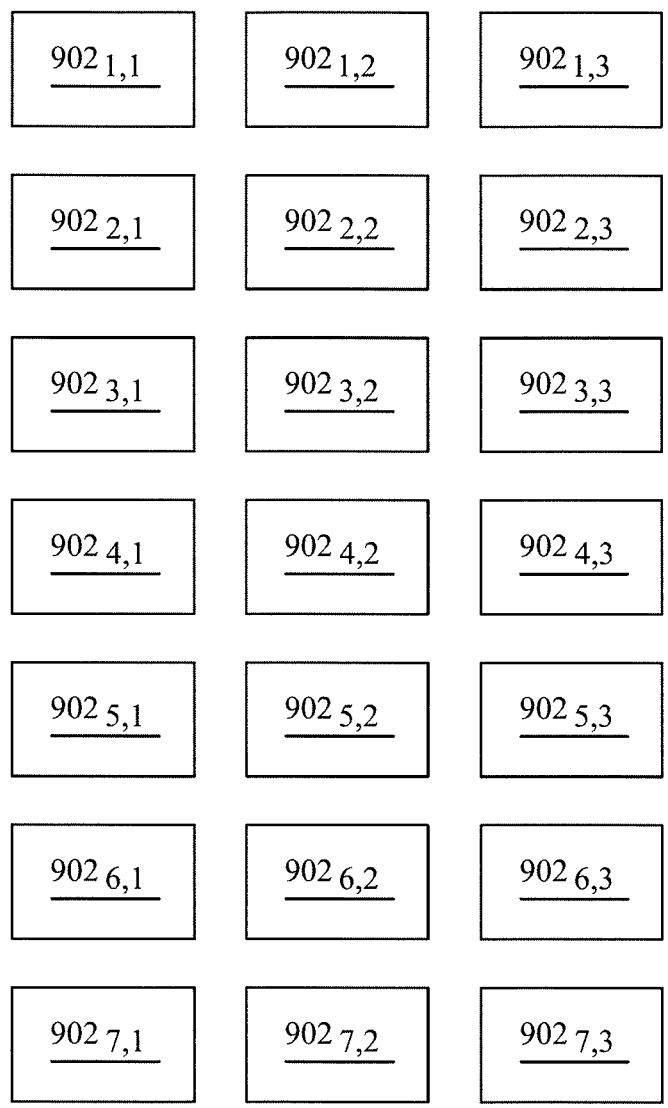
FIG. 9 illustrates a substrate carrier having a plurality of electrostatic chuck panel configurations according to one or more embodiments.

In one or more embodiments, multiple electrostatic chuck panels may be disposed across a substrate carrier in an electrostatic chucking assembly and the configuration of the electrostatic chuck panels may be varied such that the polarities of the chucking voltages driven on adjacent electrodes of adjacent electrostatic chuck panels differ. For example, FIG. 9 illustrates an electrostatic chucking assembly 900 electrostatic chuck panels 902 which may be disposed on substrate carrier (not shown). The configuration (e.g., design or layout) of the electrostatic chuck panels may be varied across substrate carrier. The configurations may be varied such that the polarities of chucking voltages driven onto adjacent electrodes in an electrode chuck panel and the polarities of chucking voltages driven onto adjacent electrodes of adjacent electrode chuck panels differ.

For example, electrostatic chuck panel $902_{1,1}$ has a first configuration. Electrostatic chuck panels $902_{1,2}$ and $902_{7,3}$ have a second configuration. Electrostatic chuck panels $902_{1,3}$, and $902_{7,2}$ have a third configuration. Electrostatic chuck panel $902_{7,1}$ has a fourth configuration. Electrostatic chuck panels $902_{2,1}$, $902_{3,1}$, $902_{4,1}$, $902_{5,1}$, and $902_{6,1}$ have a fifth configuration. Further, electrostatic chuck panels $902_{2,2}$, $902_{2,3}$, $902_{3,2}$, $902_{3,3}$, $902_{4,2}$, $902_{4,3}$, $902_{5,2}$, $902_{5,3}$, $902_{6,2}$, and $902_{6,3}$ have a sixth configuration. The first, second, third, fourth, fifth, and sixth configuration differ in at least one of electrode or electrode segment layout within the electrostatic chuck panels. The varied configurations of the electrostatic chuck panels are selected such that adjacent electrodes in adjacent electrostatic chuck panels and adjacent electrodes in the same electrostatic chuck panels are driven with chucking voltages having different polarities.

Further, in one embodiment, the top electrode in electrostatic chuck panels $902_{1,1}$, $902_{1,3}$, $902_{2,2}$, $902_{3,1}$, $902_{3,3}$, $902_{4,2}$, $902_{5,1}$, $902_{5,3}$, $902_{6,2}$, $902_{7,1}$, and $902_{7,3}$ is driven with a chucking voltage having a first polarity and the bottom electrode in electrostatic chuck panels $902_{1,2}$, $902_{2,1}$, $902_{2,3}$, $902_{3,2}$, $902_{4,1}$, $902_{4,3}$, $902_{5,2}$, $902_{6,1}$, $902_{6,3}$, and $902_{7,2}$ are driven with a chucking voltage having a second polarity. In other embodiment, the electrodes of the electrostatic chuck panels may be driven using other methods such that adjacent electrodes in adjacent electrostatic chuck panels and adjacent electrodes in the same electrostatic chuck panels are driven with chucking voltages having different polarities.

While FIG. 9 illustrates one layout of electrostatic chuck panels 902, and in other embodiments, other layouts are possible. For example, in various embodiments, more or less electrostatic chuck panel configurations may be employed. The number of the different electrostatic chuck panel configurations may be selected such that adjacent electrodes in adjacent electrostatic chuck panels and adjacent electrodes in the same electrostatic chuck panels are driven with chucking voltages having different polarities to provide a zero residual electrostatic field on the top surface of the substrate across electrostatic chuck panels of a substrate carrier.

Figure 10:
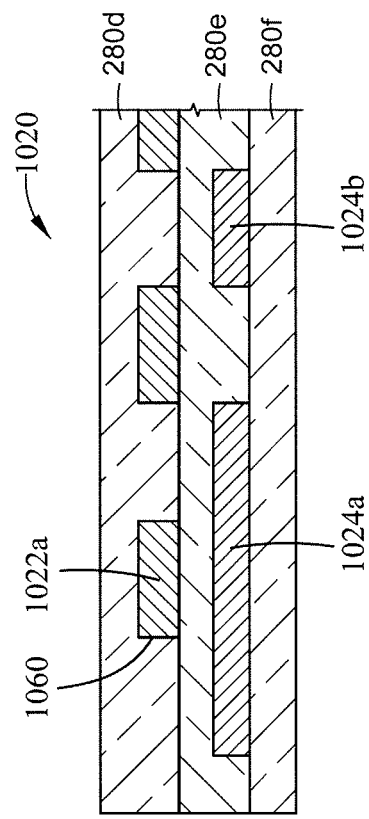
FIG. 10 illustrates a schematic partial view of two electrostatic chuck panels on either side of a gas groove in the substrate carrier according to one or more embodiments.
Figure 10:
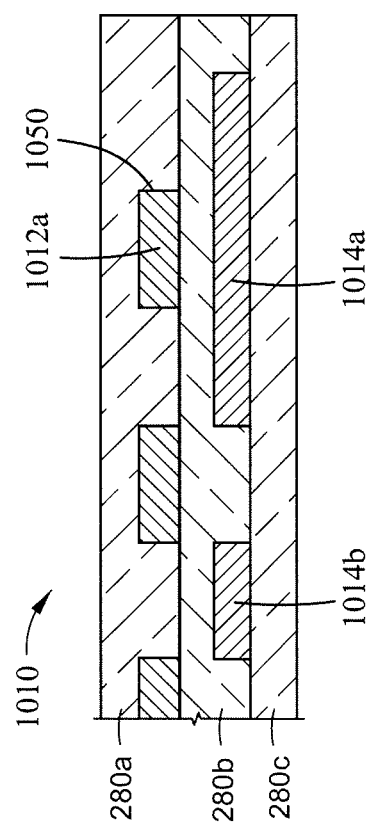

FIG. 10 illustrates a portion of a schematic view of electrostatic chuck panels 1010 and 1020. As illustrated electrode 1014a is disposed on dielectric sheet 280c, electrode 1012 is disposed on dielectric sheet 280b, electrode 1024 is disposed on dielectric sheet 280f, and electrode 1022 is disposed on dielectric sheet 280e. Further, one or more segments of electrodes 1014 and 1024 (e.g., segments 1014a and 1024a) are larger than another segment of that same electrode. For example, electrode segment 1014a has a larger width than that of electrode segment 1014b, such that electrode segment 1014a extends beyond edge 1050 of electrode segment 1012a. Further, electrode segment 1024a has a larger width than electrode segment 1024b such that electrode segment 1024a extends beyond edge 1060 of electrode segment 1022a.

Increasing the width of electrode segments 1014a and 1024a as compared to the other segments, reduces the distance between these two electrode segments. Accordingly, the residual electrostatic field on the top surface of a substrate between the two electrostatic chuck panels 1010 and 1020 electrodes is also reduced. In an embodiment, a groove is disposed between electrostatic chuck panels 1010 and 1020 which serves as the gas groove for distributing backside gas between the substrate and chuck panels. The groove may have a width of about 0.5 mm. Further, the width of the groove may be determined based on an amount of residual electrostatic field that exists between the electrodes. In one or more embodiments, a distance between electrode segments 1014a and 1024a may be between about 0.5 mm to about 1 mm.

The electrostatic chucks described herein are suitable for use substrate carriers, substrate supports and the like, for securing substrates during processing. Advantageously, each electrostatic chuck panel may be independently replaced, thus reducing the time and cost to repair the ESC. The electrostatic chuck panels described herein produce a uniform and high chucking force and also reduce the residual electrostatic field on the top surface of the substrate close to zero thereby facilitating uniform processing of substrates.

While the foregoing is directed to embodiments described herein, other and further embodiments may be devised without departing from the basic scope thereof, and the scope thereof is determined by the claims that follow.

What is claimed is:

1. A substrate carrier comprising:
a first electrostatic chuck panel comprising:
   a first electrode residing in a single plane and adapted to be driven with a chucking voltage having a first polarity; and
   a second electrode residing in a single plane and adapted to be driven with a chucking voltage having a second polarity different than the first polarity; and
a second electrostatic chuck panel disposed adjacent to the first electrostatic chuck panel and comprising:
   a first electrode residing in a single plane and adapted to be driven with the chucking voltage having the second polarity, the first electrode of the second electrostatic chuck panel is disposed adjacent to the first electrode of the first electrostatic chuck panel; and
   a second electrode residing in a single plane and adapted to be driven with the chucking voltage having the first polarity, wherein the first polarity is different than the second polarity.

2. The substrate carrier of claim 1, further comprising:
a third electrostatic chuck panel disposed adjacent to the first electrostatic chuck panel and comprising:
   a first electrode residing in a single plane and adapted to be driven with the chucking voltage having the second polarity, and disposed adjacent to the first electrode of the first electrostatic chuck panel; and
   a second electrode residing in a single plane and adapted to be driven with the chucking voltage having the first polarity; and
a fourth electrostatic chuck panel disposed adjacent to the second electrostatic chuck panel and comprising:
   a first electrode residing in a single plane and adapted to be driven with a chucking voltage having the first polarity, and disposed adjacent to the first electrode of the second electrostatic chuck panel; and
   a second electrode residing in a single plane and adapted to be driven with a chucking voltage having the second polarity.

3. The substrate carrier of claim 1, wherein:
the first electrode of the first electrostatic chuck panel comprises a first plurality of segments connected at first corners;

the second electrode of the first electrostatic chuck panel comprises a second plurality of segments connected at second corners;
a first segment of the first plurality of segments and a second segment of the second plurality of segments are adjacent and parallel to each other and are separated by a first distance; and
a first corner of the first corners has a first side and is adjacent to a second corner of the second corners having a second side, the first corner is separated from the second corner by a second distance and has a first radius.

4. The substrate carrier of claim 3, wherein the first distance is about equal to the second distance.

5. The substrate carrier of claim 1, wherein the first electrode of the first electrostatic chuck panel comprises a first plurality of segments disposed on a first dielectric layer, and the second electrode of the first electrostatic chuck panel comprises a second plurality of segments disposed on a second dielectric layer over the first dielectric layer, and wherein a horizontal spacing between the first plurality of segments and the second plurality of segments is greater than or equal to zero.

6. The substrate carrier of claim 1, wherein a height of the first and second electrodes of the first electrostatic chuck panel is in a range of about 6 um to about 9 um, and a height of the first and second electrodes of the second electrostatic chuck panel is in a range of about 6 um to about 9 um.

7. The substrate carrier of claim 1, wherein a distance between the first electrode of the first electrostatic chuck panel and the first electrode of the second electrostatic chuck panel is less than six times a distance between the first electrode and the second electrode of the first electrostatic chuck panel.

* * * * *